US010381412B2

(12) United States Patent
Leem et al.

(10) Patent No.: US 10,381,412 B2
(45) Date of Patent: Aug. 13, 2019

(54) ORGANIC PHOTOELECTRONIC DEVICE

(71) Applicant: Samsung Electronics Co., Ltd., Suwon-si, Gyeonggi-do (KR)

(72) Inventors: Dong-Seok Leem, Hwaseong-si (KR); Seon-Jeong Lim, Yongin-si (KR); Kwang Hee Lee, Hwaseong-si (KR); Xavier Bulliard, Seongnam-si (KR); Yong Wan Jin, Seoul (KR); Tadao Yagi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 267 days.

(21) Appl. No.: 15/334,586

(22) Filed: Oct. 26, 2016

(65) Prior Publication Data
US 2017/0154929 A1 Jun. 1, 2017

(30) Foreign Application Priority Data
Nov. 30, 2015 (KR) ........................ 10-2015-0169053

(51) Int. Cl.
*H01L 27/30* (2006.01)
*H01L 51/00* (2006.01)
*H01L 51/42* (2006.01)
*H01L 51/44* (2006.01)
*H01L 51/50* (2006.01)

(52) U.S. Cl.
CPC .......... *H01L 27/307* (2013.01); *H01L 51/006* (2013.01); *H01L 51/0061* (2013.01); *H01L 51/0065* (2013.01); *H01L 51/424* (2013.01); *H01L 51/4293* (2013.01); *H01L 51/442* (2013.01); *H01L 51/0053* (2013.01); *H01L 51/0058* (2013.01); *H01L 51/0062* (2013.01); *H01L 51/5004* (2013.01); *H01L 2251/303* (2013.01); *Y02E 10/549* (2013.01)

(58) Field of Classification Search
CPC ................................... H01L 51/0061
See application file for complete search history.

(56) References Cited

U.S. PATENT DOCUMENTS

| | | |
|---|---|---|
| 6,087,258 A | 7/2000 | Simpson et al. |
| 6,300,612 B1 | 10/2001 | Yu |
| 6,824,952 B1 | 11/2004 | Minsek et al. |
| 6,972,431 B2 | 12/2005 | Forrest et al. |
| 7,129,466 B2 | 10/2006 | Iwasaki |
| 7,141,863 B1 | 11/2006 | Compaan et al. |
| 7,973,307 B2 | 7/2011 | Rand et al. |
| 8,035,708 B2 | 10/2011 | Takizawa et al. |
| 8,378,339 B2 | 2/2013 | Nomura et al. |
| 8,426,727 B2 | 4/2013 | Pfeiffer et al. |
| 8,471,246 B2 | 6/2013 | Suzuki et al. |
| 8,525,577 B2 | 9/2013 | Yofu et al. |
| 8,637,860 B2 | 1/2014 | Nomura et al. |
| 8,704,213 B2 | 4/2014 | Suzuki |
| 8,704,281 B2 | 4/2014 | Maehara et al. |
| 8,847,141 B2 | 9/2014 | Fukuzaki et al. |
| 8,847,208 B2 | 9/2014 | Mitsui et al. |
| 8,860,016 B2 | 10/2014 | Suzuki |
| 8,933,438 B2 | 1/2015 | Leem et al. |
| 8,994,132 B2 | 3/2015 | Mitsui et al. |
| 9,070,888 B2 | 6/2015 | Leem |
| 9,543,361 B2 | 1/2017 | Leem et al. |
| 9,548,463 B2 | 1/2017 | Yagi et al. |
| 9,960,362 B2 | 5/2018 | Bulliard et al. |
| 2005/0217722 A1 | 10/2005 | Komatsu et al. |
| 2007/0012955 A1 | 1/2007 | Ihama |
| 2007/0063156 A1 | 3/2007 | Hayashi |
| 2007/0090371 A1 | 4/2007 | Drechsel et al. |
| 2010/0207112 A1 | 8/2010 | Furst et al. |
| 2011/0012091 A1 | 1/2011 | Forrest et al. |
| 2011/0074491 A1 | 3/2011 | Yofu et al. |
| 2012/0126204 A1 | 5/2012 | So et al. |
| 2012/0266958 A1 | 10/2012 | Aksu et al. |
| 2012/0313088 A1 | 12/2012 | Yofu et al. |
| 2013/0062595 A1 | 3/2013 | Park et al. |
| 2013/0087682 A1 | 4/2013 | Nomura |
| 2013/0181202 A1 | 7/2013 | Yofu et al. |
| 2014/0008619 A1 | 1/2014 | Lee et al. |
| 2014/0054442 A1 | 2/2014 | Huang et al. |
| 2014/0083496 A1 | 3/2014 | Shibasaki et al. |

(Continued)

FOREIGN PATENT DOCUMENTS

| | | |
|---|---|---|
| CN | 104230953 A | 12/2014 |
| DE | 102004014046 A1 | 9/2004 |

(Continued)

OTHER PUBLICATIONS

European Search Report dated Apr. 26, 2017 issued in corresponding European Application No. 16195944.0-1552.
I.G. Hill et al., Organic Electronics, "Metal-dependent charge transfer and chemical interaction at interfaces between 3,4,9,10-perylenetetracarboxylic bisimidazole and gold, silver and magnesium", vol. 1, Issue 1, Dec. 2000, pp. 5-13.
U.S. Appl. No. 15/461,914, filed Mar. 17, 2017.
Advanced Materials (1997), 9(2), 132-135.
Jap. J. Appl. Phys. 46(49), 2007, L1240-L1242.
IEEE Trans. Electron. Dev., 56(11), 2009, 2570.
IDW '09, INP 1-4.
Scientific Reports 5, Article No. 7708 (2015).

(Continued)

*Primary Examiner* — Joseph R Kosack
(74) *Attorney, Agent, or Firm* — Harness, Dickey & Pierce, P.L.C.

(57) ABSTRACT

An organic photoelectronic device includes a first electrode and a second electrode facing each other, photoelectronic conversion layer between the first electrode and the second electrode and including a first material and a second material providing a p-n junction and an interlayer being adjacent to the first electrode between the first electrode and the photoelectronic conversion layer and including a third material, wherein the first material and the third material are an organic material having each energy bandgap of about 1.7 eV to about 2.3 eV, and an image sensor including the same is provided.

16 Claims, 12 Drawing Sheets

(56) References Cited

U.S. PATENT DOCUMENTS

| | | |
|---|---|---|
| 2014/0159752 A1 | 6/2014 | Tsai et al. |
| 2014/0209173 A1 | 7/2014 | Momose |
| 2014/0319509 A1 | 10/2014 | Hattori et al. |
| 2015/0053942 A1 | 2/2015 | Kho et al. |
| 2015/0060775 A1 | 3/2015 | Liang et al. |
| 2015/0162548 A1 | 6/2015 | Lim et al. |
| 2015/0228811 A1 | 8/2015 | Hiroi et al. |
| 2015/0349073 A1 | 12/2015 | Kang |
| 2016/0013248 A1 | 1/2016 | Sawaki |
| 2016/0013424 A1 | 1/2016 | Yamamoto et al. |
| 2016/0020258 A1 | 1/2016 | Park et al. |
| 2016/0064672 A1 | 3/2016 | Lee et al. |
| 2016/0099417 A1 | 4/2016 | Sato et al. |
| 2016/0111561 A1 | 4/2016 | Hsu et al. |
| 2016/0111651 A1 | 4/2016 | Yun et al. |
| 2016/0126470 A1 | 5/2016 | Ro et al. |
| 2016/0149132 A1 | 5/2016 | Lim et al. |
| 2016/0197281 A1 | 7/2016 | Momose et al. |
| 2016/0268401 A1 | 9/2016 | Aleksov |
| 2017/0005142 A1 | 1/2017 | Lee et al. |
| 2017/0074652 A1 | 3/2017 | Send et al. |
| 2017/0117424 A1 | 4/2017 | Hiroi et al. |
| 2017/0294589 A1 | 10/2017 | Shibuya et al. |

FOREIGN PATENT DOCUMENTS

| | | |
|---|---|---|
| EP | 0529162 A1 | 3/1993 |
| EP | 2317582 A1 | 5/2011 |
| EP | 3026722 A1 | 6/2016 |
| JP | H09-311232 A | 12/1997 |
| JP | H10-091384 A | 4/1998 |
| JP | 2005132914 A | 5/2005 |
| JP | 2006-261172 A | 9/2006 |
| JP | 2007-234650 A | 9/2007 |
| JP | 2009-274966 A | 11/2009 |
| JP | 2011-225544 A | 11/2011 |
| JP | 2011-253861 A | 12/2011 |
| JP | 2012-123292 A | 6/2012 |
| JP | 2012-151761 A | 8/2012 |
| JP | 2013-040147 A | 2/2013 |
| JP | 5323025 B2 | 10/2013 |
| JP | 2014-049559 A | 3/2014 |
| JP | 2014-210768 A | 11/2014 |
| JP | 2015-015415 A | 1/2015 |
| JP | 2015-043362 A | 3/2015 |
| JP | 2015-700600 A | 4/2015 |
| JP | 2015-092546 A | 5/2015 |
| KR | 10-2014-0106767 A | 9/2014 |
| KR | 10-2015-0066616 A | 6/2015 |
| KR | 10-2016-0009404 A | 1/2016 |
| KR | 10-2016-0024686 A | 3/2016 |
| KR | 10-2016-0052448 A | 5/2016 |
| KR | 10-2016-0062708 A | 6/2016 |
| WO | WO-2002/064600 A1 | 8/2002 |
| WO | WO-2008/0191670 A2 | 7/2008 |
| WO | WO-2010/011658 A2 | 1/2010 |
| WO | WO-2010/038721 A1 | 4/2010 |
| WO | WO-2014/157238 A1 | 10/2014 |
| WO | WO-2014/169270 A2 | 10/2014 |

OTHER PUBLICATIONS

Journal of Synthetic Organic Chemistry, Japan, vol. 63 (2005) No. 9 p. 911-920.

The Biophysical Society of Japan, vol. 2, pp. 23-34 (2006).

J. Phys. Chem. A 2013, 117, 9259-9265.

Extended European Search Report dated May 22, 2017, for corresponding European Patent Application No. 17161078.5.

Juha Alakarhu. "Image Sensors and Image Quality in Mobile Phones". International Image Sensor Workshop. 2007. pp. 1-4.

Hokuto Seo et al. "Color Sensors with Three Vertically Stacked Organic Photodetectors". Japanese Journal of Applied Physics vol. 46, No. 49. The Japan Society of Applied Physics. 2007. pp. L1240-L1242.

European Search Report issued in corresponding European Patent Application No. 17150423.6-1555 dated Aug. 4, 2017.

Drechsel J. et al: "Efficient organic solar cells based on a double p-i-n architecture using doped wide-gap transport layers", Applied Physics Letters, AIP Publishing LLC, US, vol. 86, No. 24, Jun. 7, 2005 (Jun. 7, 2005), pp. 244102-244102, XP012065900, ISSN: 0003-6951, DOI: 10.1063/1.1935771.

Marzena Grucela-Zajac et al., "(Photo) physical Properties of New Molecular Glasses End-Capped with Thiophene Rings Composed of Diimide and Imine Units", The Journal of Physical Chemistry, May 21, 2014, pp. 13070-13086, ACS Author Choice.

Gorkem Memisoglu et al., "Highly Efficient Organic UV Photodetectors Based on Polyfluorene and Naphthalenediimide Blends: Effect of Thermal Annealing", 2012, International Journal of Photoenergy vol. 2012, Article ID 936075, 11 pages, Hindawi Publishing Corporation.

Jiri Misek et al., "A Chiral and Colorful Redox Switch: Enhanced p Acidity in Action", 2010, Angew. Chem. Int. Ed. 2010, 49, 7680-7683, Wiley-VCH Verlag GmbH & Co. KGaA, Weinheim.

European Search Report for corresponding European Application No. 17150423.6-1555 dated Aug. 4, 2017.

European Search Report for Application No. 17177002.7 dated Nov. 17, 2017.

U.S. Office Action dated Mar. 8, 2018 issued in co-pending U.S. Appl. No. 15/461,914.

U.S. Office Action dated Jan. 5, 2018 issued in co-pending U.S. Appl. No. 15/362,964.

U.S. Office Action dated Jun. 1, 2018 issued in co-pending U.S. Appl. No. 15/362,964.

U.S. Office Action dated Jul. 3, 2017 issued in co-pending U.S. Appl. No. 15/255,649.

U.S. Office Action dated Jan. 29, 2018 issued in co-pending U.S. Appl. No. 15/255,649.

U.S. Office Action dated Aug. 24, 2018 issued in co-pending U.S. Appl. No. 15/461,914.

U.S. Office Action dated Aug. 6, 2018 issued in co-pending U.S. Appl. No. 15/623,801.

U.S. Office Action dated Jul. 25, 2018 issued in co-pending U.S. Appl. No. 15/272,580.

Notice of Allowance dated Dec. 20, 2017, issued in co-pending U.S. Appl. No. 15/609,125.

U.S. Office Action dated Feb. 14, 2018 issued in co-pending U.S. Appl. No. 15/272,580.

ORGANIC PHOTOELECTRONIC DEVICE

CROSS REFERENCE TO RELATED APPLICATIONS

This application claims priority to and the benefit of Korean Patent Application No. 10-2015-0169053 filed in the Korean Intellectual Property Office on Nov. 30, 2015, the entire contents of which are incorporated herein by reference.

BACKGROUND

1. Field

Example embodiments include an organic photoelectronic device.

2. Description of the Related Art

A photoelectronic device converts light into an electrical signal using photoelectronic effects. The photoelectronic device may include a photodiode, a phototransistor, and may be applied to an image sensor, a solar cell and/or an organic light emitting diode.

An image sensor including a photodiode requires high resolution and thus a small pixel. At present, a silicon photodiode is widely used, but it has a problem of deteriorated sensitivity since it has a relatively small absorption area due to relatively small pixels. Accordingly, an organic material that is capable of replacing silicon has been researched.

The organic material has a relatively high extinction coefficient and selectively absorbs light in a particular wavelength spectrum of light depending on a molecular structure, and thus may simultaneously replace a photodiode and a color filter and resultantly improve sensitivity and contribute to higher integration.

However, the organic material may be different from silicon due to having a relatively higher binding energy than silicon and exhibiting a recombination behavior. Thus, an organic photoelectronic device that includes the organic material may exhibit a relatively low photoelectronic conversion efficiency, and thus relatively low photoelectronic conversion performance, relative to a silicon-based photoelectronic device.

This low photoelectronic conversion efficiency may be solved by applying a reverse bias voltage to the organic photoelectronic device, but the organic photoelectronic device may have a relatively high dark current density due to a charge injected therein in the reverse bias state.

In addition, the organic material may be thermally weak and thus may deteriorate in the presence of an elevated temperature, (e.g., during a subsequent process). Therefore, the photoelectronic conversion performance of the organic photoelectronic device may be deteriorated relative to the photoelectronic conversion performance of a silicon-based photoelectronic device.

SUMMARY

Some example embodiments provide an organic photoelectronic device being capable of reinforcing heat resistance and lowering dark current density.

Some example embodiments provide an image sensor including the organic photoelectronic device.

According to some example embodiments, an organic photoelectronic device may include a first electrode; a second electrode on the first electrode; a photoelectronic conversion layer between the first electrode and the second electrode, the photoelectronic conversion layer including a p-n junction, the p-n junction including a first material and a second material; and an interlayer adjacent to the first electrode, the interlayer being between the first electrode and the photoelectronic conversion layer and including a third material. Each of the first material and the third material may be an organic material having an energy bandgap of about 1.7 eV to about 2.3 eV.

An energy bandgap difference between the energy bandgap of the first material and the energy bandgap of the third material may be less than or equal to about 0.1 eV.

A HOMO energy level difference of the first material and the third material or a LUMO energy level difference of the first material and the third material may be less than about 0.2 eV.

Each of the first material and the third material may include an organic material, the organic material having a core structure including an electron-donating moiety, a pi-conjugation linker and an electron-accepting moiety.

The first material and the third material may have a common core structure.

The first material and the third material each include a compound represented by Chemical Formula 1,

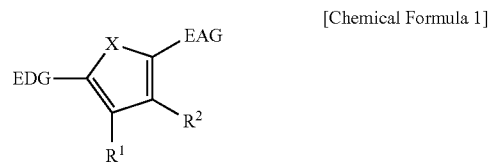

[Chemical Formula 1]

wherein, in Chemical Formula 1, X is one of Se, Te, SO, $SO_2$, and $SiR^aR^b$, EDG is an electron donating group, EAG is an electron accepting group, each of $R^1$ and $R^2$ are independently one of hydrogen and a monovalent substituent, and each of $R^a$ and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The first material may be represented by Chemical Formula 1A, and the third material is represented by Chemical Formula 1B,

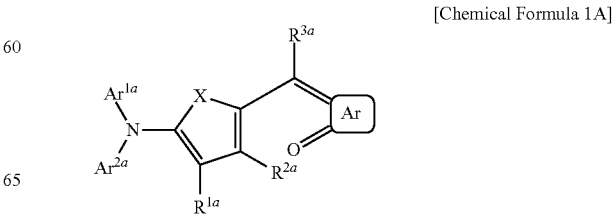

[Chemical Formula 1A]

[Chemical Formula 1B]

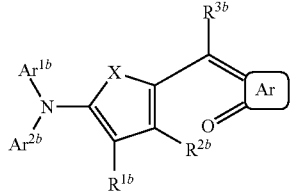

wherein, in Chemical Formulae 1A and 1B, X is one of Se, Te, SO, $SO_2$, and $SiR^aR^b$, Ar is one of a substituted or unsubstituted 5-membered aromatic ring, a substituted or unsubstituted 6-membered aromatic ring, and a fused ring of the two or more foregoing rings, each of $Ar^{1a}$, $Ar^{2a}$, $Ar^{1b}$, and $Ar^{2b}$ are independently one of a substituted or unsubstituted $C_6$ to $C_{30}$ aryl group, and a substituted or unsubstituted $C_3$ to $C_{30}$ heteroaryl group, and each of $R^{1a}$ to $R^{3a}$, $R^{1b}$ to $R^{3b}$, $R^a$, and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The first material may be represented by Chemical Formula 1A-1, and the third material may be represented by Chemical Formula 1B-1,

[Chemical Formula 1A-1]

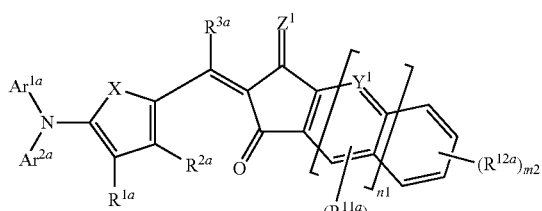

[Chemical Formula 1B-1]

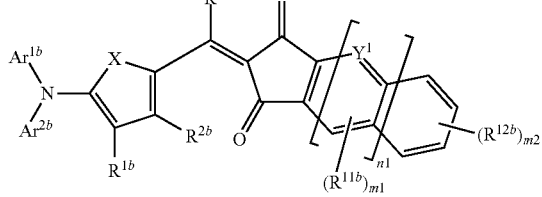

wherein, in Chemical Formulae 1A-1 and 1B-1, X is one of Se, Te, SO, $SO_2$, and $SiR^aR^b$, $Z^1$ is one of O and $CR^cR^d$, $Y^1$ is one of N and $CR^e$, each of $Ar^{1a}$, $Ar^{2a}$, $Ar^{1b}$ and $Ar^{2b}$ are independently one of a substituted or unsubstituted $C_6$ to $C_{30}$ aryl group, and a substituted or unsubstituted $C_3$ to $C_{30}$ heteroaryl group, each of $R^{1a}$ to $R^{3a}$, $R^{11a}$, $R^{12a}$, $R^{1b}$ to $R^{3b}$, $R^{11b}$, $R^{12b}$, and $R^a$ to $R^e$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group, m1 is 0 or 1, m2 is an integer inclusively between 0 and 4, and n1 is 0 or 1.

The first material may be represented by Chemical Formula 1A-2, and the third material may be represented by Chemical Formula 1B-2,

[Chemical Formula 1A-2]

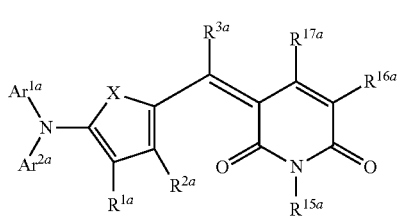

[Chemical Formula 1B-2]

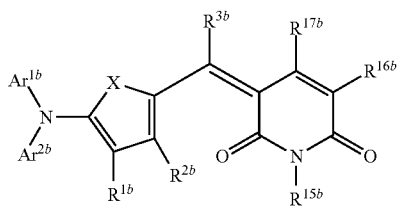

wherein, in Chemical Formulae 1A-2 and 1B-2, X is one of Se, Te, SO, $SO_2$, and $SiR^aR^b$, each of $Ar^{1a}$, $Ar^{2a}$ $Ar^{1b}$ and $Ar^{2b}$ are independently one of a substituted or unsubstituted $C_6$ to $C_{30}$ aryl group, and a substituted or unsubstituted $C_3$ to $C_{30}$ heteroaryl group, and each of $R^{1a}$ to $R^{3a}$, $R^{15a}$ to $R^{17a}$, $R^{1b}$ to $R^{3b}$, $R^{15a}$ to $R^{17a}$, and $R^a$ and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The first material may be represented by Chemical Formula 1A-3, and the third material may be represented by Chemical Formula 1B-3,

[Chemical Formula 1A-3]

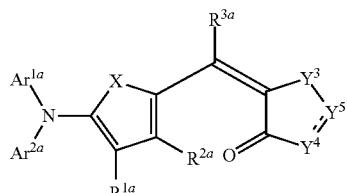

[Chemical Formula 1B-3]

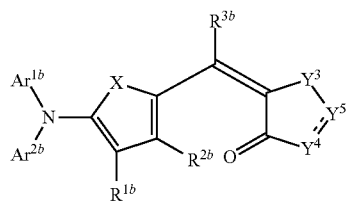

wherein, in Chemical Formulae 1A-3 and 1B-3, X is one of Se, Te, SO, $SO_2$, and $SiR^aR^b$, $Y^3$ is one of O, S, Se, and Te, $Y^4$ is one of N and $NR^{18}$, $Y^5$ is one of $CR^{19}$ and $C=CR^{20}(CN)$, each of $Ar^{1a}$, $Ar^{2a}$, $Ar^{1b}$ and $Ar^{2b}$ are independently one of a substituted or unsubstituted $C_6$ to $C_{30}$ aryl group, and a substituted or unsubstituted $C_3$ to $C_{30}$ heteroaryl group, and each of $R^{1a}$ to $R^{3a}$, $R^{1b}$ to $R^{3b}$, $R^{18}$ to $R^{20}$, $R^a$, and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The interlayer may include a metal oxide.

The metal oxide may include at least one of a molybdenum oxide, tungsten oxide, vanadium oxide, rhenium oxide, and nickel oxide.

The organic photoelectronic device may include an auxiliary layer between the second electrode and the photoelectronic conversion layer, wherein the auxiliary layer includes a metal oxide.

The auxiliary layer may include at least one of a molybdenum-containing oxide, a tungsten-containing oxide, a vanadium-containing oxide, a rhenium-containing oxide, a nickel-containing oxide, a manganese-containing oxide, a chromium-containing oxide, and a cobalt-containing oxide.

The auxiliary layer may include at least one of molybdenum oxide, tungsten oxide, vanadium oxide, rhenium oxide, nickel oxide, manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, and potassium cobalt oxide.

The auxiliary layer may further include a metal.

The metal may include at least one of aluminum (Al), calcium (Ca), magnesium (Mg), lithium (Li), gold (Au), silver (Ag), and copper (Cu).

The first electrode may be an anode and the second electrode is a cathode.

Some example embodiments may include an image sensor that includes the organic photoelectronic device. Some example embodiments may include an electronic device that includes the image sensor.

According to some example embodiments, an organic photoelectronic device may include a photoelectronic conversion layer including a p-n junction, the p-n junction including a first material and a second material; and an interlayer on the photoelectronic conversion layer and including a third material. Each of the first material and the third material may be an organic material having an energy bandgap of about 1.7 eV to about 2.3 eV.

According to some example embodiments, an organic photoelectronic device may include a photoelectronic conversion layer including a p-n junction, the p-n junction including a first material and a second material; and an interlayer on the photoelectronic conversion layer and including a third material, wherein the first material and the third material each include a compound represented by Chemical Formula 1,

[Chemical Formula 1]

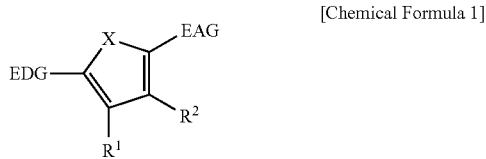

wherein, in Chemical Formula 1, X is one of Se, Te, SO, $SO_2$, and $SiR^aR^b$, EDG is an electron donating group, EAG is an electron accepting group, each of $R^1$ and $R^2$ are independently one of hydrogen and a monovalent substituent, and each of $R^a$ and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

DETAILED DESCRIPTION

Figure 1A:
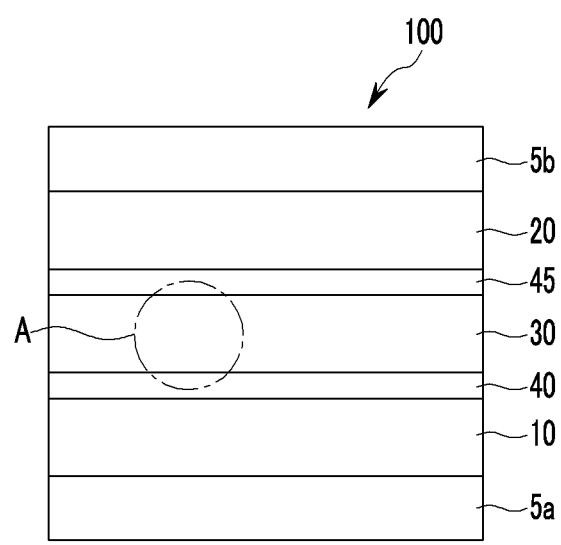
FIG. 1A is a cross-sectional view showing an organic photoelectronic device according to some example embodiments.

Example embodiments will hereinafter be described in detail, and may be more easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element including a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, 'a combination thereof' refers to a mixture and a stacking structure of two or more.

As used herein, when specific definition is not otherwise provided, the term "substituted" refers to one substituted with a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_{30}$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_3$ to $C_{30}$ heterocycloalkyl group, and a combination thereof, instead of hydrogen of a compound or a group.

Hereinafter, an organic photoelectronic device according to some example embodiments is described with reference to drawings.

Figure 1B:
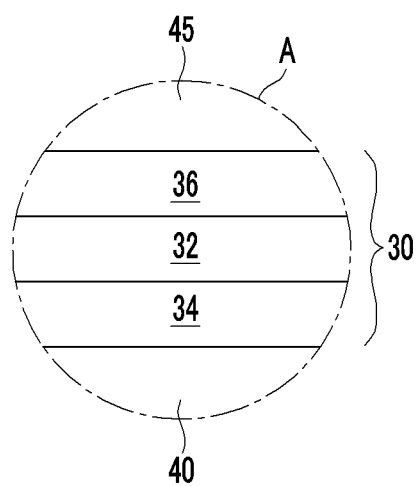
FIG. 1B is a cross-sectional view showing a portion of the organic photoelectronic device of FIG. 1A.

FIG. 1A is a cross-sectional view showing an organic photoelectronic device according to some example embodiments. FIG. 1B is a cross-sectional view showing a portion of the organic photoelectronic device of FIG. 1A.

Referring to FIG. 1A, an organic photoelectronic device 100 according to some example embodiments includes a first electrode 10 and a second electrode 20, a photoelectronic conversion layer 30 between the first electrode 10 and the second electrode 20, an interlayer 40 between the first electrode 10 and the photoelectronic conversion layer 30, and an auxiliary layer 45 between the second electrode 20 and the photoelectronic conversion layer 30.

A substrate 5a may be under the first electrode 10 and a substrate 5b may be on the second electrode 20. The substrate may at least partially comprise, for example, an inorganic material including glass, an organic material including polycarbonate, polymethylmethacrylate, polyethylene terephthalate, polyethylene naphthalate, polyamide, polyethersulfone, or a combination thereof, or a silicon wafer.

One of the first electrode 10 and the second electrode 20 is an anode, and the other is a cathode. For example, the first electrode 10 may be an anode, and the second electrode 20 may be a cathode.

At least one of the first electrode 10 and the second electrode 20 may be a light-transmitting electrode, and the light-transmitting electrode may at least partially comprise, for example, a conductive oxide including indium tin oxide (ITO) or indium zinc oxide (IZO), zinc oxide (ZnO), tin oxide (SnO), aluminum tin oxide (AlTO), and fluorine doped tin oxide (FTO), or a metal thin layer of a thin monolayer or multilayer. When one of the first electrode 10 and the second electrode 20 is a non-light-transmitting electrode, the non-light-transmitting electrode may at least partially comprise, for example, an opaque conductor including aluminum (Al), silver (Ag), and/or gold (Au). For example, the first electrode 10 and the second electrode 20 may be light-transmitting electrodes.

The photoelectronic conversion layer 30 may include a first material and a second material forming a p-n junction. One of the first material and the second material may be a p-type semiconductor and the other may be an n-type semiconductor. For example, the first material may be a p-type semiconductor and the second material may be an n-type semiconductor. At least one of the first material and the second material may be an organic material. The photoelectronic conversion layer 30 may absorb external light to generate excitons and then separate the generated excitons into holes and electrons.

The photoelectronic conversion layer 30 maybe configured to absorb light in at least one part of a wavelength spectrum of light, for example one of a wavelength spectrum of green light of about 500 nm to about 600 nm, a wavelength spectrum of blue light of greater than or equal to about 380 nm and less than about 500 nm, and a wavelength spectrum of red light of greater than about 600 nm and less than or equal to about 780 nm.

In some example embodiments, at least one of the first material and the second material may be a light-absorbing material configured to selectively absorb one of green light, blue light, and red light.

In some example embodiments, at least one of the first material and the second material may be an organic material configured to selectively absorb at least one of green light, blue light, and red light.

In some example embodiments, at least one of the first material and the second material may be a light-absorbing material configured to selectively absorb a wavelength spectrum of green light having a maximum absorption wavelength ($\lambda_{max}$) in about 520 nm to about 580 nm.

In some example embodiments, at least one of the first material and the second material may be an organic material configured to selectively absorb light in a green wavelength spectrum of light having a maximum absorption wavelength ($\lambda_{max}$) of about 520 nm to about 580 nm.

In some example embodiments, one of the first material and the second material may be an organic material configured to selectively absorb light in a green wavelength spectrum of light having a maximum absorption wavelength ($\lambda_{max}$) of about 520 nm to about 580 nm, and another one of the first material and the second material may be fullerene or a fullerene derivative.

In some example embodiments, the first material may be an organic material configured to selectively absorb light in a green wavelength spectrum of light having a maximum absorption wavelength ($\lambda_{max}$) of about 520 nm to about 580 nm and the second material may be fullerene or a fullerene derivative. In some example embodiments, the first material may be a p-type semiconductor and the second material may be an n-type semiconductor.

In some example embodiments, the first material may be an organic material having an energy bandgap of about 1.7 eV to about 2.3 eV. If and/or when the energy bandgap is within a particular range, including a range of about 1.7 eV to about 2.3 eV, light in a green wavelength spectrum of light having a maximum absorption wavelength ($\lambda_{max}$) of about 520 nm to about 580 nm may be selectively absorbed at the first material and external quantum efficiency (EQE) may increase, and thus photoelectric conversion efficiency may be improved. For example, the first material may be an organic material having an energy bandgap of about 1.8 eV to about 2.2 eV. In another example, the first material may be an organic material having an energy bandgap of about 1.9 eV to about 2.1 eV.

In some example embodiments, the first material may be an organic material having an energy bandgap of about 1.7 eV to about 2.3 eV, and the organic material may have a core structure including an electron-donating moiety, a pi-conjugation linker, and an electron-accepting moiety. The electron-donating moiety may donate electrons to form holes if and/or when it receives light and the electron-accepting moiety may receive electrons if and/or when it receives light.

The organic material having the core structure may have bipolar characteristics due to the electron-donating moiety and the electron-accepting moiety. In some example embodiments, electron flow may be controlled based on the pi-conjugation linker between the electron-accepting moiety and the electron-accepting moiety.

In some example embodiments, the first material may be a compound represented by Chemical Formula 1.

[Chemical Formula 1]

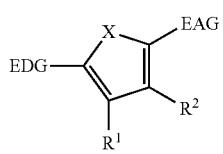

In Chemical Formula 1,
X is one of Se, Te, SO, $SO_2$, and $SiR^aR^b$,
EDG is an electron donating group,
EAG is an electron accepting group, and
each of $R^1$ and $R^2$ are independently one of hydrogen and a monovalent substituent. In Chemical Formula 1, each of $R^a$ and $R^b$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

In some example embodiments, the first material may be a compound represented by Chemical Formula 1A.

[Chemical Formula 1A]

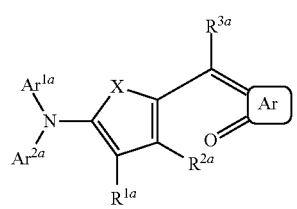

In Chemical Formula 1A,
X is one of Se, Te, SO, $SO_2$, and $SiR^aR^b$,
Ar is one of a substituted or unsubstituted 5-membered aromatic ring, a substituted or unsubstituted 6-membered aromatic ring, and a fused ring of the two or more foregoing rings,
each of $Ar^{1a}$ and $Ar^{2a}$ are independently a substituted or unsubstituted $C_6$ to $C_{30}$ aryl group and a substituted or unsubstituted $C_3$ to $C_{30}$ heteroaryl group, and
each of $R^{1a}$ to $R^{3a}$ and $R^a$ and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The compound represented by Chemical Formula 1A includes an electron-donating moiety of arylamine, a pi-conjugation linker of heterocyclic group, and an electron-accepting moiety represented by Ar.

In some example embodiments, the first material may be one of the compounds represented by one of Chemical Formulae 1A-1 to 1A-3.

[Chemical Formula 1A-1]

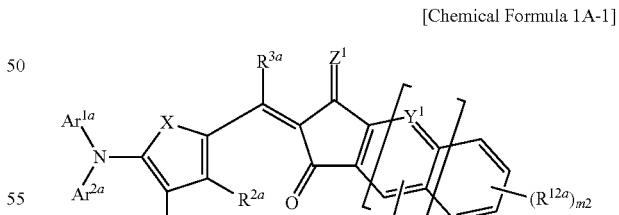

[Chemical Formula 1A-2]

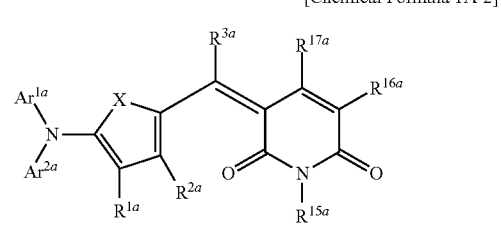

[Chemical Formula 1A-3]

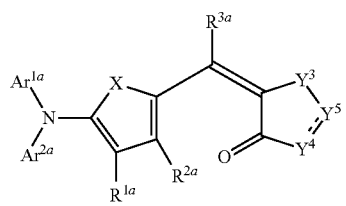

In Chemical Formulae 1A-1 to 1A-3,

X is one of Se, Te, SO, $SO_2$, and $SiR^aR^b$, $Z^1$ is one of O and $CR^cR^d$, $Y^1$ is one of N and $CR^e$, $Y^3$ is one of O, S, Se, and Te, $Y^4$ is one of N and $NR^{18}$, $Y^5$ is one of $CR^{19}$ and $C=CR^{20}(CN)$, each of $Ar^{1a}$ and $Ar^{2a}$ are independently one of a substituted or unsubstituted $C_6$ to $C_{30}$ aryl group, and a substituted or unsubstituted $C_3$ to $C_{30}$ heteroaryl group, each of $R^{1a}$ to $R^{3a}$, $R^{11a}$, $R^{12a}$, $R^{15a}$ to $R^{17a}$, $R^{18}$ to $R^{20}$, and $R^a$ to $R^e$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group, m1 is 0 or 1, m2 is an integer that is inclusively between 0 and 4, and n1 is 0 or 1.

In some example embodiments, the first material may be one of the compounds of Group 1, but is not limited thereto.

[Group 1]

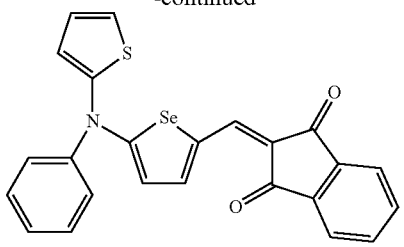

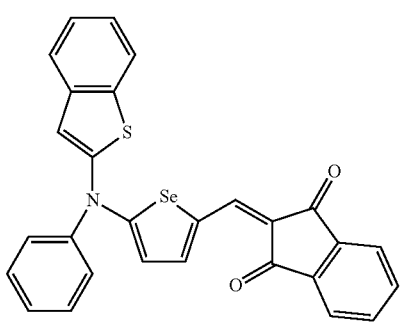

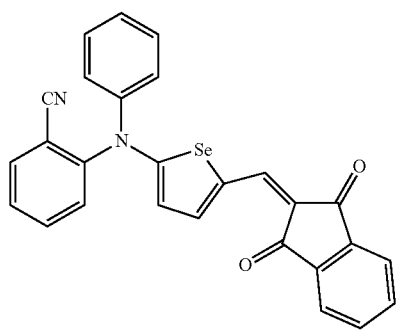

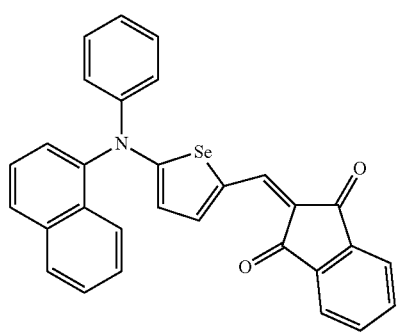

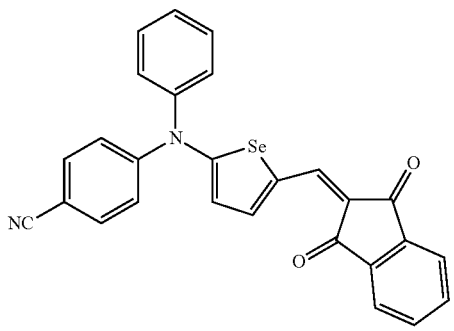

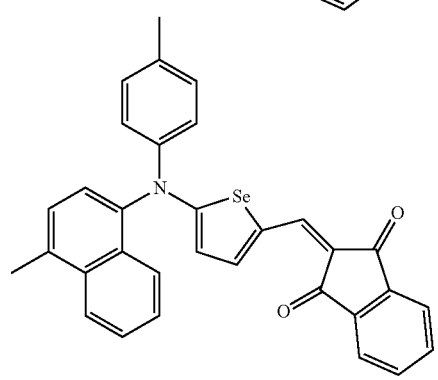

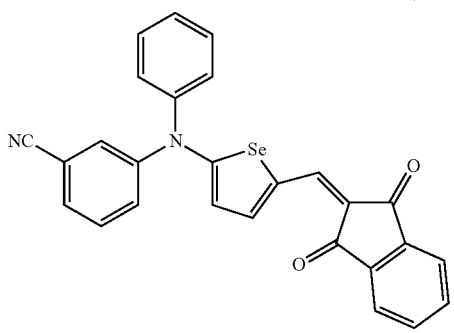

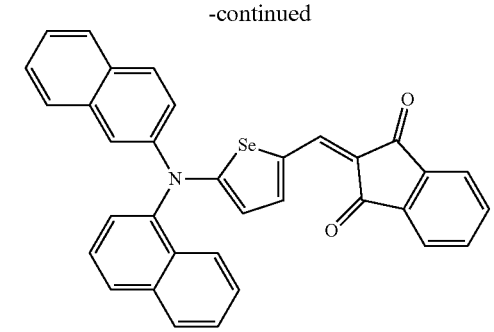
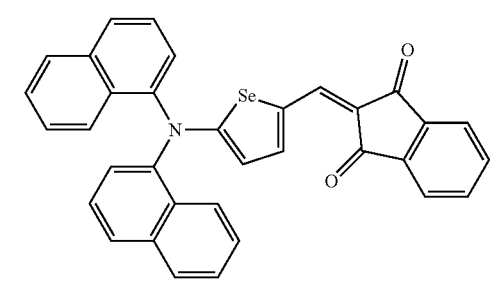
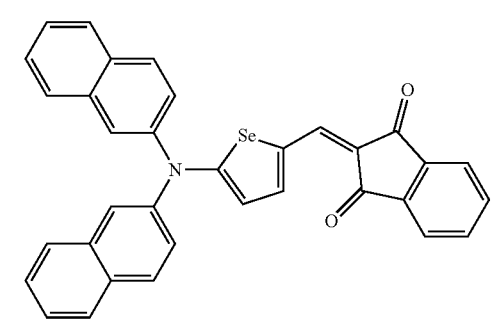
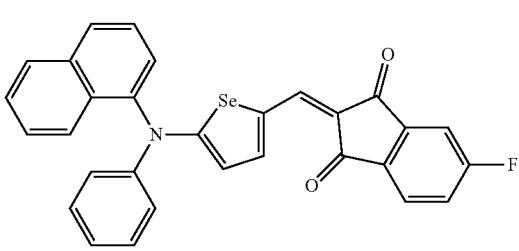
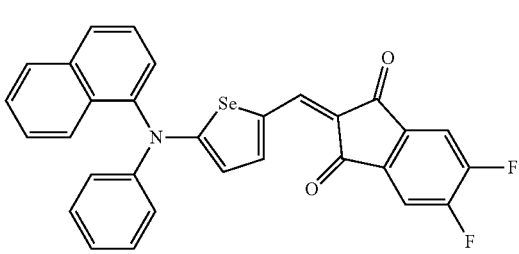
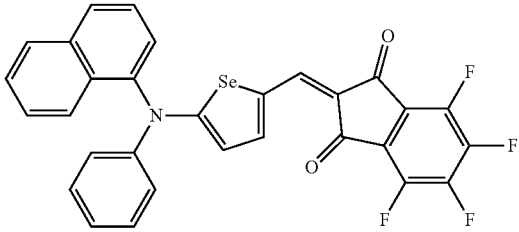
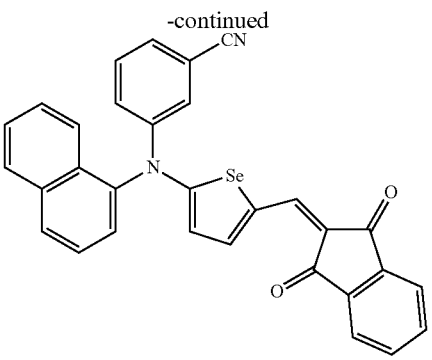
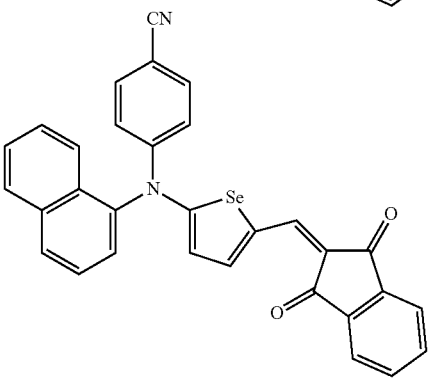
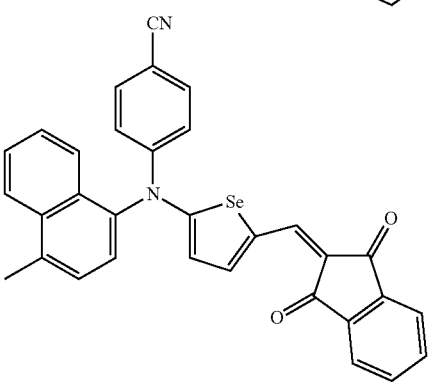
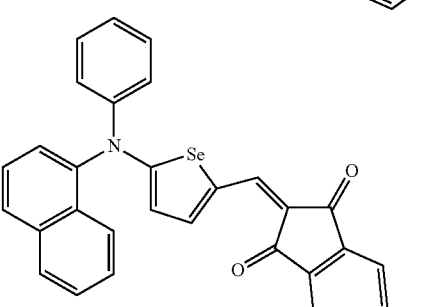
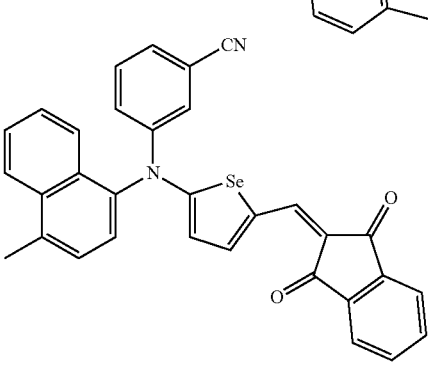

15
-continued
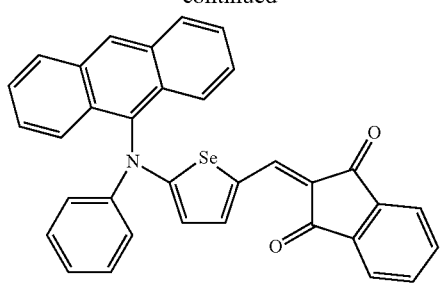
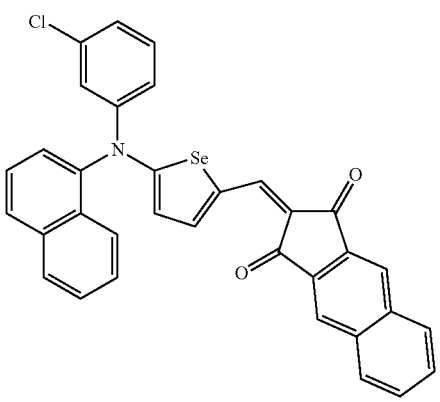
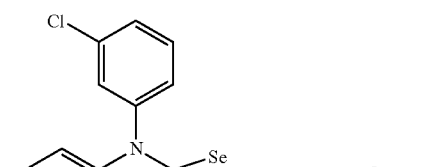
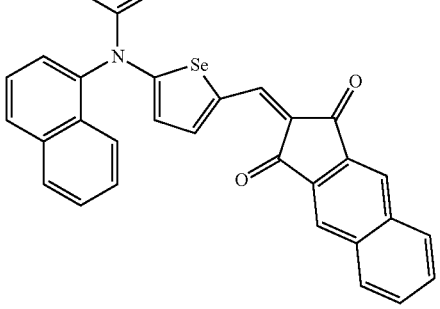
16
-continued
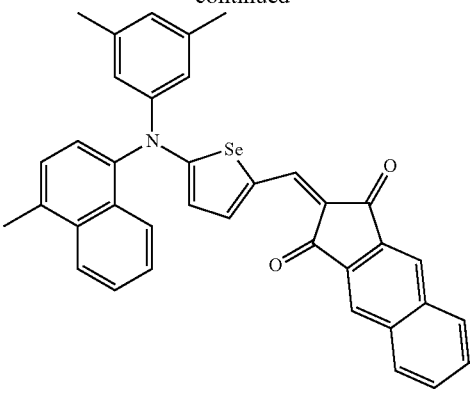
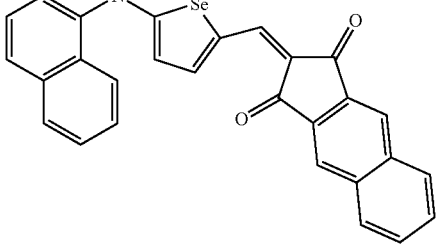
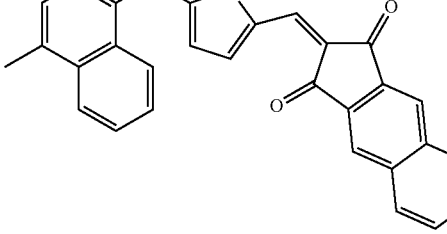

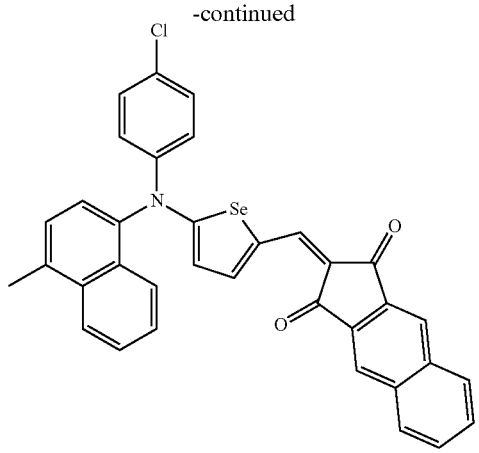
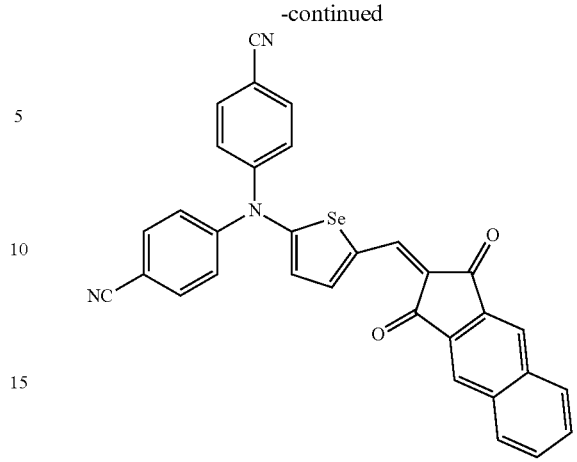
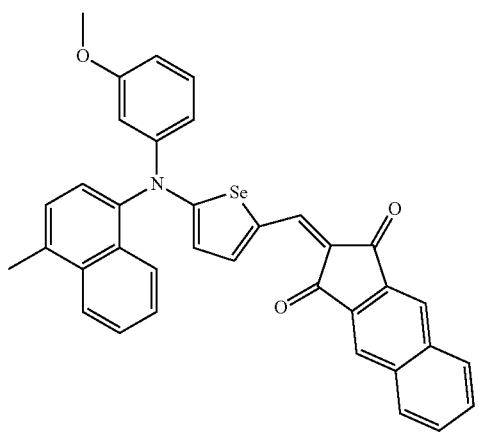
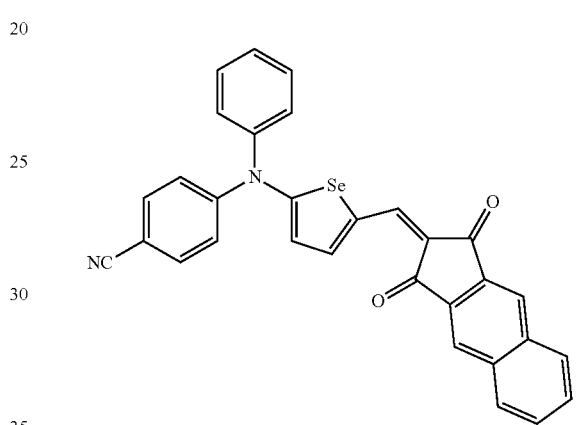
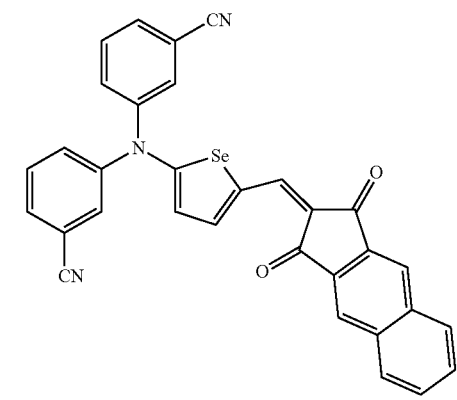
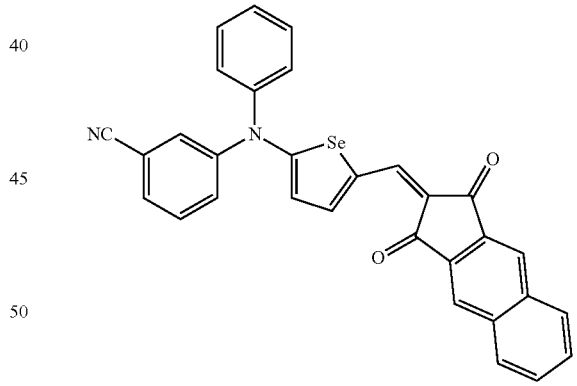
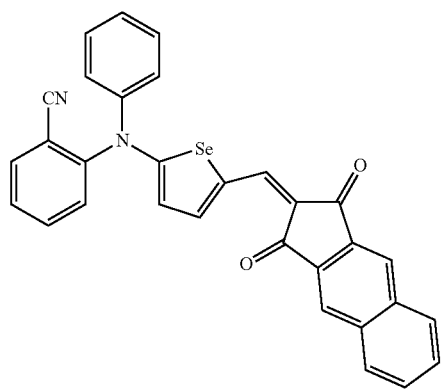
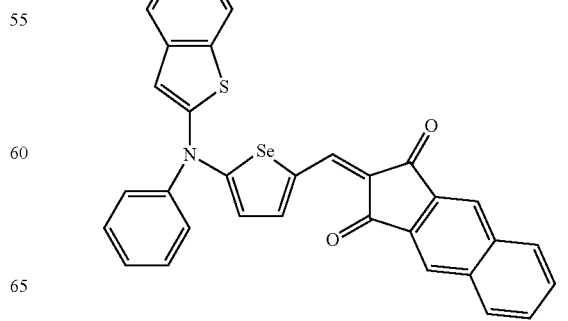

19
-continued
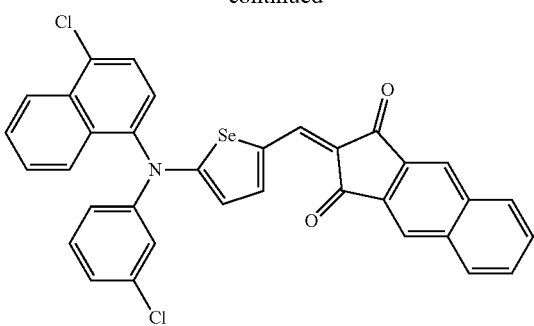
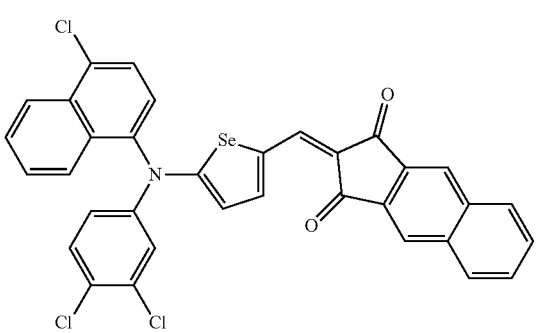
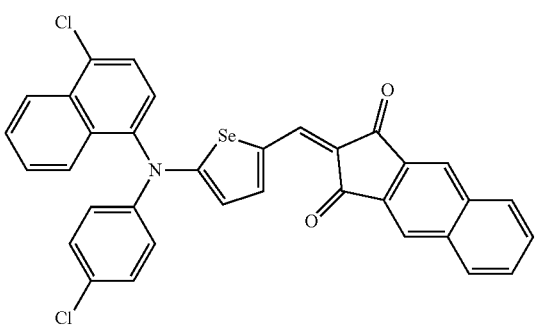
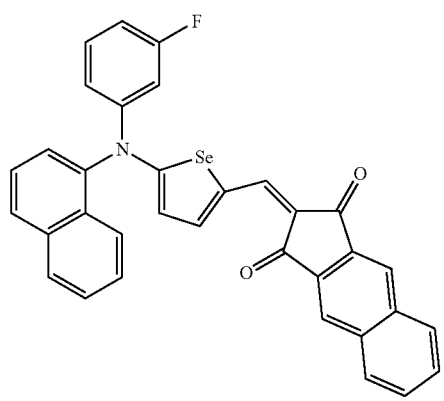
20
-continued
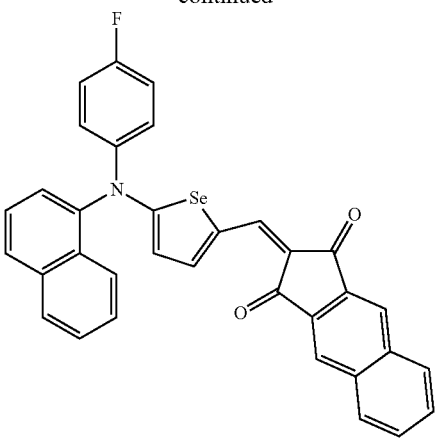
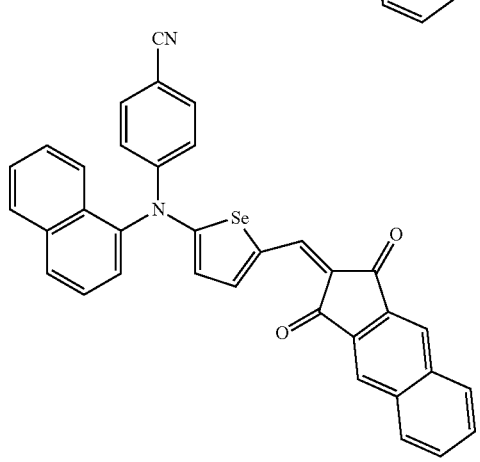
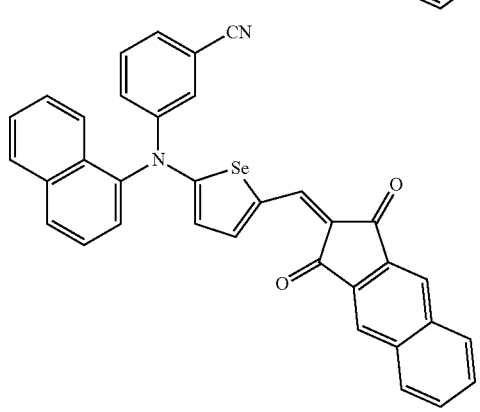
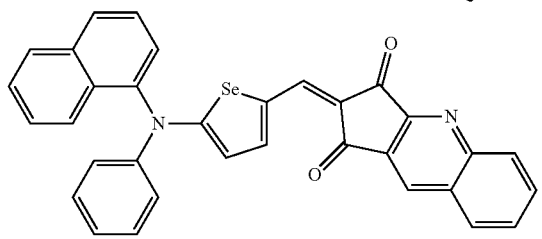
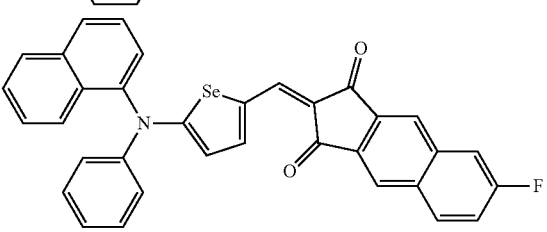

-continued
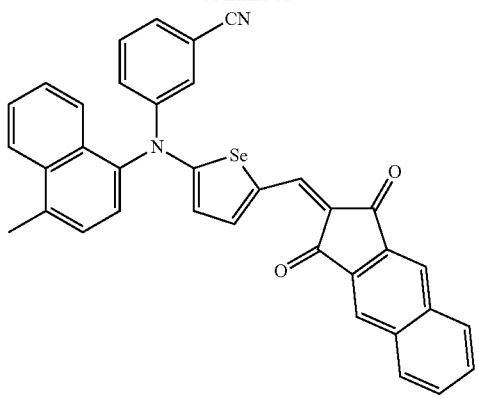
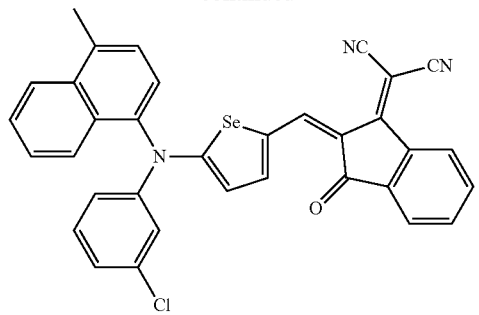
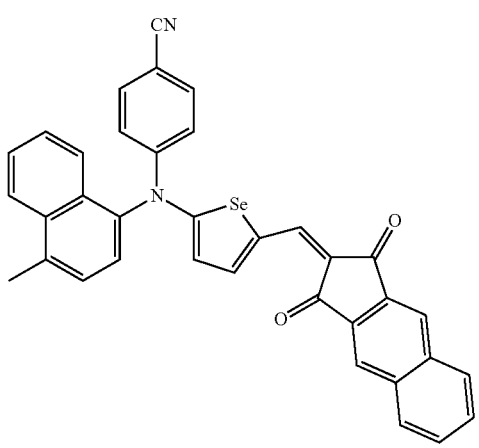
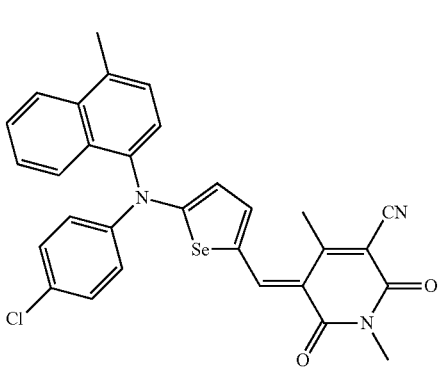
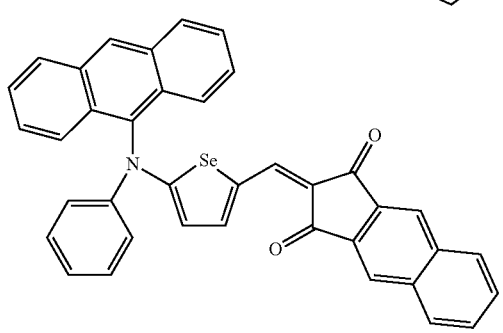
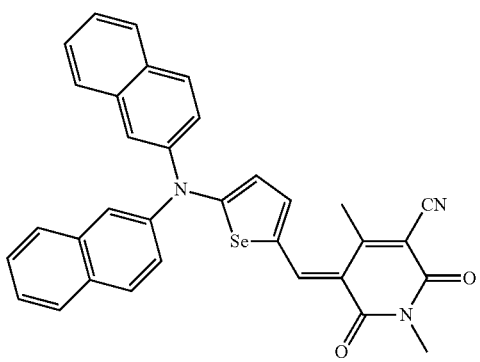
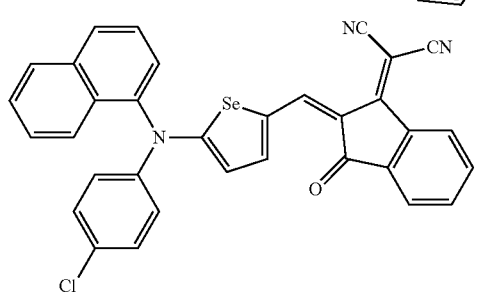
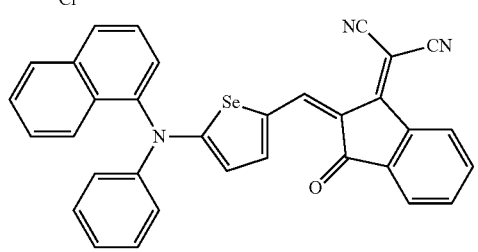
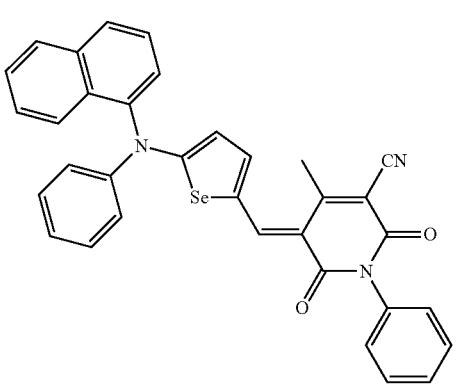

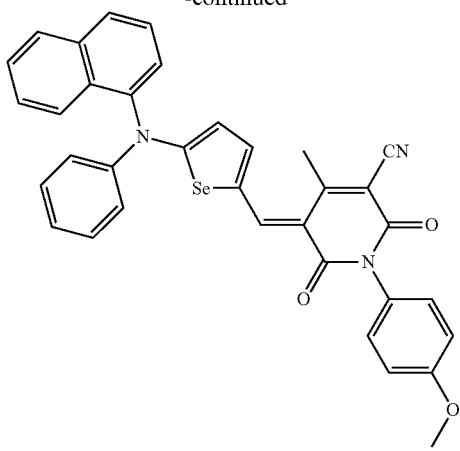
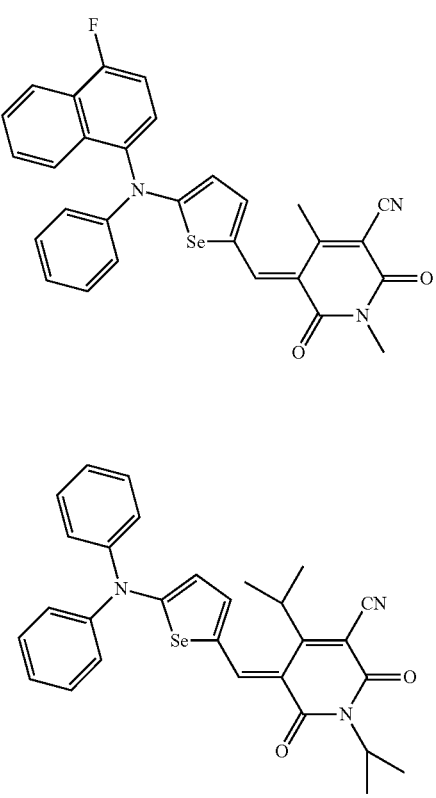
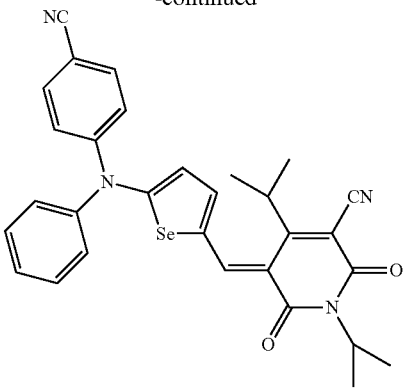
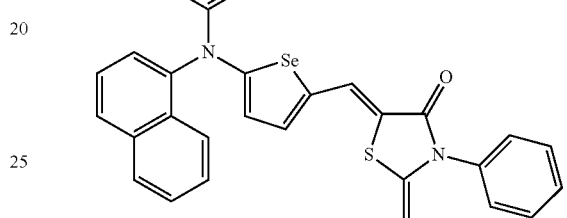
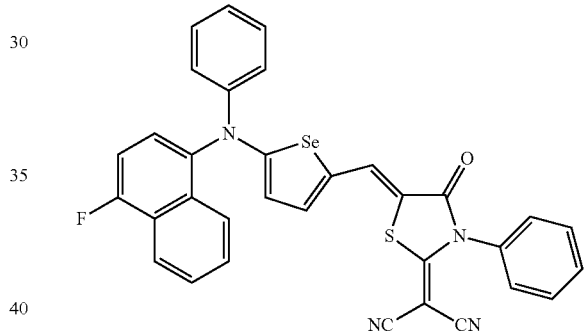
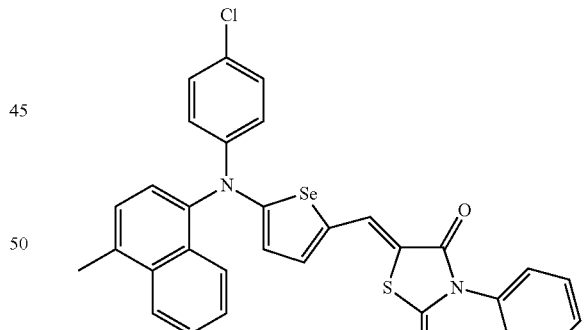

In some example embodiments, including the example embodiments illustrated in FIG. 1B, the photoelectronic conversion layer 30 may include an intrinsic layer (I layer) 32 including the first material and the second material. The intrinsic layer may include a mixture of the first material and the second material in a volume ratio of about 10:1 to about 1:10, for example, about 8:2 to about 2:8 or about 6:4 to about 4:6. The photoelectronic conversion layer 30 may further include a p-type layer 34 and/or an n-type layer 36 on one side or both sides of the intrinsic layer 32. The p-type layer may include a p-type semiconductor that is one of the first material and the second material, and the n-type layer may include an n-type semiconductor that is another one of the first material and the second material. For example, the photoelectronic conversion layer 30 may include I layer 32, a p-type layer 34/I layer 32, an I layer 32/n-type layer 36, a p-type layer 34/I layer 32/n-type layer 36, some combination thereof, or the like.

The photoelectronic conversion layer 30 may include a p-type layer 34 and an n-type layer 36. The p-type layer 34 may include a p-type semiconductor that is one of the first material and the second material, and the n-type layer 36 may include an n-type semiconductor that is another one of the first material and the second material.

The photoelectronic conversion layer 30 may have a thickness of about 1 nm to about 500 nm, and specifically, about 5 nm to about 300 nm. If and/or when the photoelectronic conversion layer 30 has a thickness within the range of about 5 nm to about 300 nm, the photoelectronic conversion layer may be configured to effectively absorb light, effectively separate holes from electrons, and transfer them, thereby effectively improving photoelectronic conversion efficiency.

The interlayer 40 may be positioned between the first electrode 10 and the photoelectronic conversion layer 30, and may be, for example adjacent to the first electrode 10. For example, the interlayer 40 may contact the first electrode 10 without interposing a separate layer. The interlayer 40 may contact the photoelectronic conversion layer 30 without interposing a separate layer.

The interlayer 40 may include an organic material, and the interlayer 40 may include a third material having a substantially equivalent or similar structure to the first material or the second material of the photoelectronic conversion layer 30. For example, the third material may have a substantially equivalent or similar structure to the first material.

The third material may be, for example, an organic material configured to selectively absorb light in a green wavelength spectrum of light having a maximum absorption wavelength ($\lambda_{max}$) of about 520 nm to about 580 nm.

The third material may be, for example an organic material having an energy bandgap of about 1.7 eV to about 2.3 eV. For example, the third material may be an organic material having an energy bandgap of about 1.8 eV to about 2.2 eV. In another example, the third material may be an organic material having an energy bandgap of about 1.9 eV to about 2.1 eV.

An energy bandgap of the first material of the photoelectronic conversion layer 30 and an energy bandgap of the third material of the interlayer 40 may be substantially the same, and for example an energy bandgap difference of the first material and the third material may be less than or equal to about 0.1 eV. In another example, an energy bandgap difference of the first material and the third material may be less than or equal to about 0.05 eV. In another example, an energy bandgap difference of the first material and the third material may be less than or equal to about 0.03 eV. In another example, an energy bandgap difference of the first material and the third material may be less than or equal to about 0.02 eV, or 0 eV.

A HOMO energy level of the first material of the photoelectronic conversion layer 30 and a HOMO energy level of the third material of the interlayer 40 may be substantially the same (e.g., the first material of the photoelectronic conversion layer 30 and the third material of the interlayer 40 may have a substantially common HOMO energy level). In some example embodiments, a difference of HOMO energy levels of the first material and the third material may be less than about 0.2 eV, for example less than or equal to about 0.1 eV.

A LUMO energy level of the first material of the photoelectronic conversion layer 30 and an LUMO energy level of the third material of the interlayer 40 may be substantially the same (e.g., the first material of the photoelectronic conversion layer 30 and the third material of the interlayer 40 may have a substantially common LUMO energy level). In some example embodiments, a difference of LUMO energy levels of the first material and the third material may be less than about 0.2 eV, for example less than or equal to about 0.1 eV.

In some example embodiments, the third material may be an organic material having a core structure including an electron-donating moiety, a pi-conjugation linker and an electron-accepting moiety like the first material.

In some example embodiments, the third material and the first material may be an organic material having the same core structure.

In some example embodiments, the third material may be a compound represented by Chemical Formula 1.

[Chemical Formula 1]

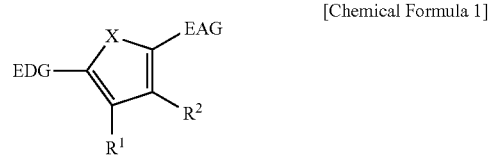

In Chemical Formula 1,

X is one of Se, Te, SO, $SO_2$, and $SiR^aR^b$,

EDG is an electron donating group,

EAG is an electron accepting group, and each of $R^1$ and $R^2$ are independently one of hydrogen and a monovalent substituent. In Chemical Formula 1, each of $R^a$ and $R^b$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

In some example embodiments, the third material may be a compound represented by Chemical Formula 1B.

[Chemical Formula 1B]

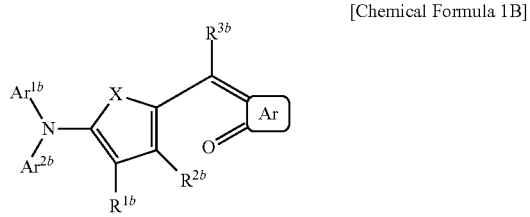

In Chemical Formula 1B,

X is one of Se, Te, SO, $SO_2$, and $SiR^aR^b$,

Ar is one of a substituted or unsubstituted 5-membered aromatic ring, substituted or unsubstituted 6-membered aromatic ring, and a fused ring of the two or more foregoing rings, each of $Ar^{1b}$ and $Ar^{2b}$ are independently one of a substituted or unsubstituted $C_6$ to $C_{30}$ aryl group and a substituted or unsubstituted $C_3$ to $C_{30}$ heteroaryl group, and each of $R^{1b}$ to $R^{3b}$, $R^a$, and $R^b$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group.

The compound represented by Chemical Formula 1B includes an electron-donating moiety of arylamine, a pi-conjugation linker of heterocycle, and an electron-accepting moiety represented by Ar.

In some example embodiments, the third material may be one of the compounds represented by one of Chemical Formulae 1B-1 to 1B-3.

[Chemical Formula 1B-1]

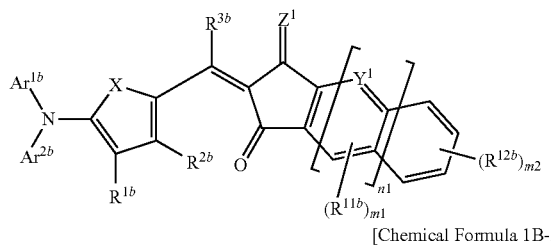

[Chemical Formula 1B-2]

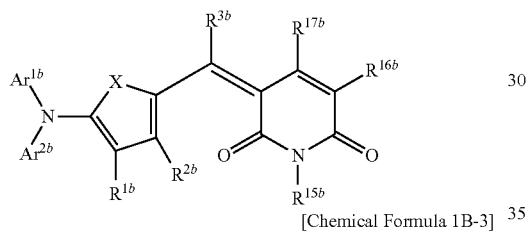

[Chemical Formula 1B-3]

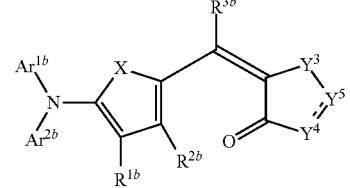

In Chemical Formulae 1B-1 to 1B-3,
X is one of Se, Te, SO, $SO_2$, and $SiR^aR^b$,
$Z^1$ is one of O and $CR^cR^d$,
$Y^1$ is one of N and $CR^e$,
$Y^3$ is one of O, S, Se, and Te,
$Y^4$ is one of N and $NR^{18}$,
$Y^5$ is one of $CR^{19}$ and $C=CR^{20}(CN)$,
each of $Ar^{1b}$ and $Ar^{2b}$ are independently one of a substituted or unsubstituted $C_6$ to $C_{30}$ aryl group, and a substituted or unsubstituted $C_3$ to $C_{30}$ heteroaryl group,
each of $R^{1b}$ to $R^{3b}$, $R^{11b}$, $R^{12b}$, $R^{15b}$ to $R^{17b}$, $R^{18}$ to $R^{20}$, and $R^a$ to $R^e$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, and a cyano group,
m1 is 0 or 1,
m2 is an integer that is inclusively between 0 and 4, and
n1 is 0 or 1.

As described above, the first material of the photoelectronic conversion layer 30 and the third material of the interlayer 40 may be organic materials having a common core structure.

In some example embodiments, the first material may be the compound represented by Chemical Formula 1A-1 and the third material may be the compound represented by Chemical Formula 1B-1.

In some example embodiments, the first material may be the compound represented by Chemical Formula 1A-2, and the third material may be the compound represented by Chemical Formula 1B-2.

In some example embodiments, the first material may be the compound represented by Chemical Formula 1A-3 and the third material may be the compound represented by Chemical Formula 1B-3.

The third material may be the same as or different from the first material, for example one of the compounds of Group 1, but is not limited thereto.

[Group 1]

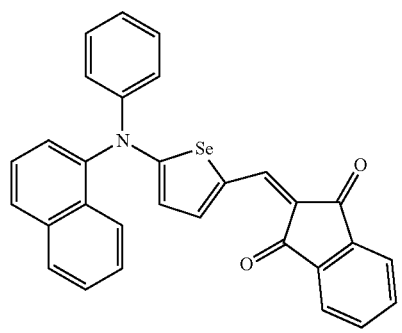

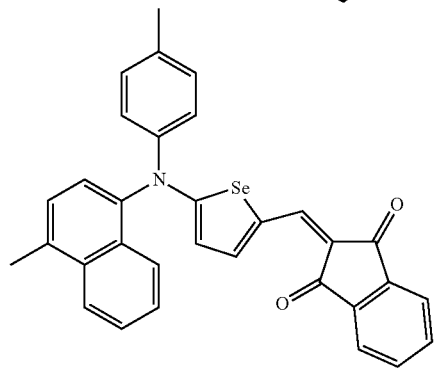

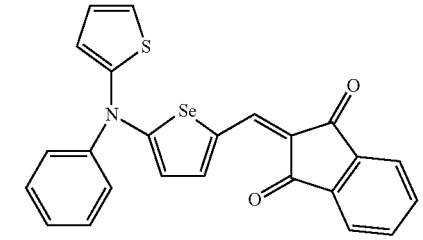

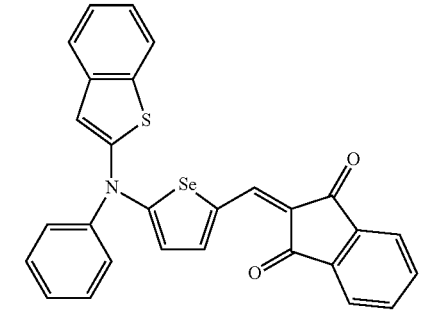

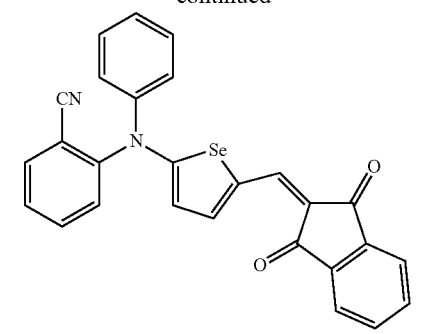
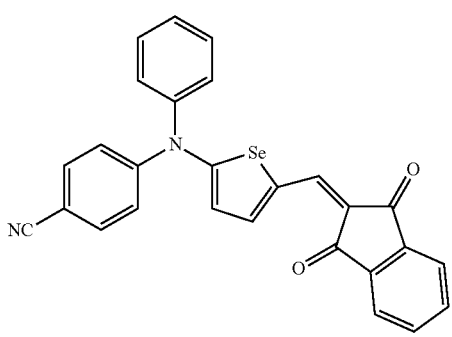
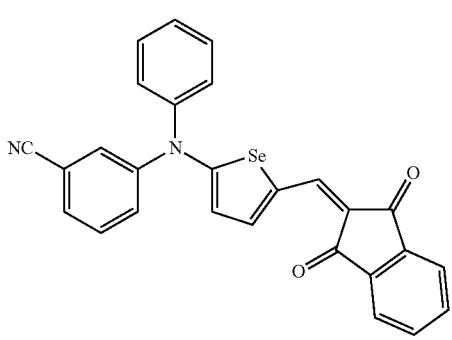
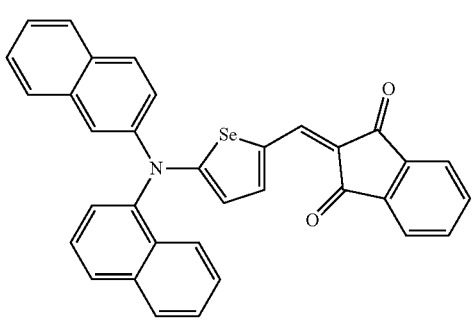
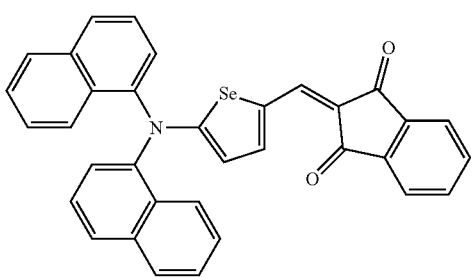
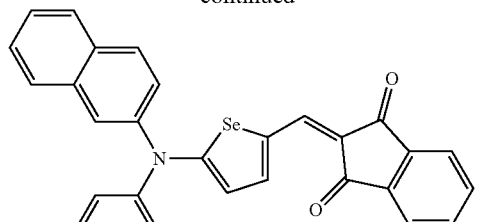
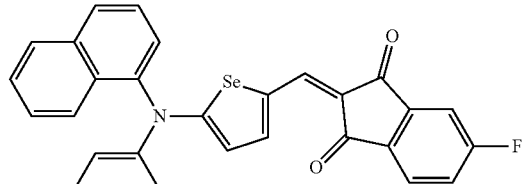
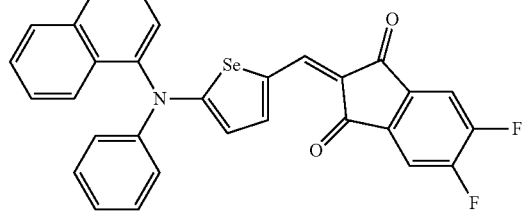
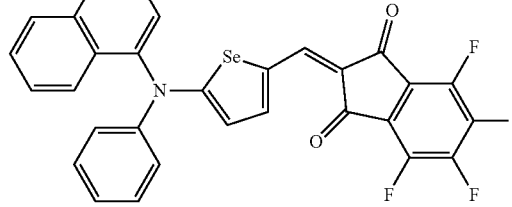
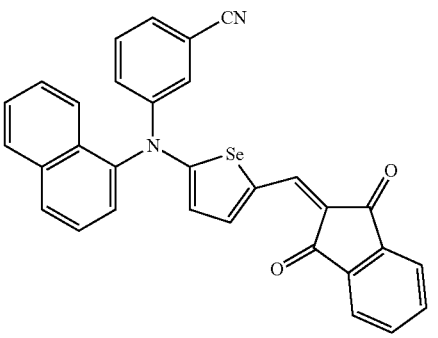
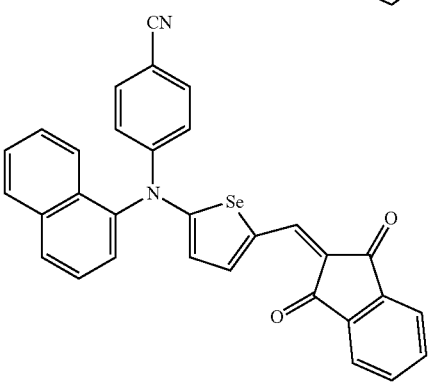

-continued
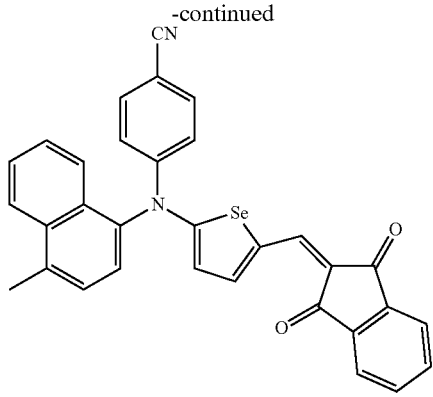
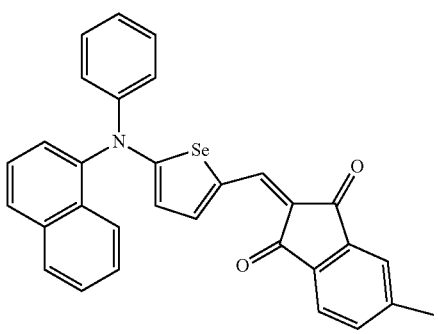
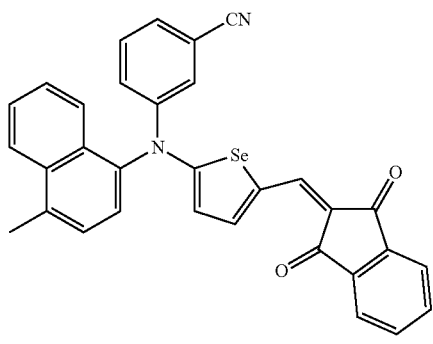
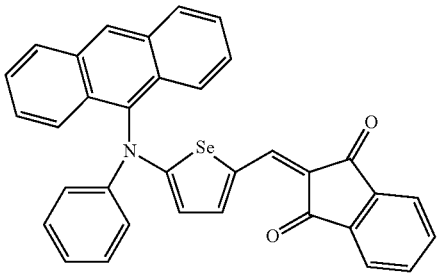
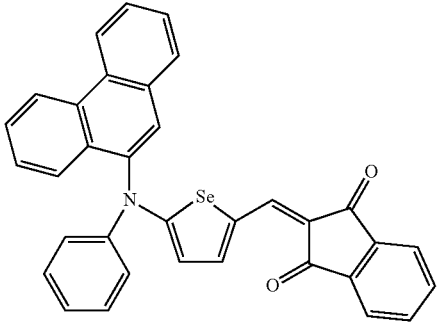
-continued
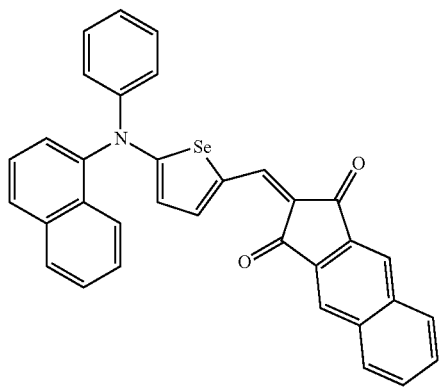
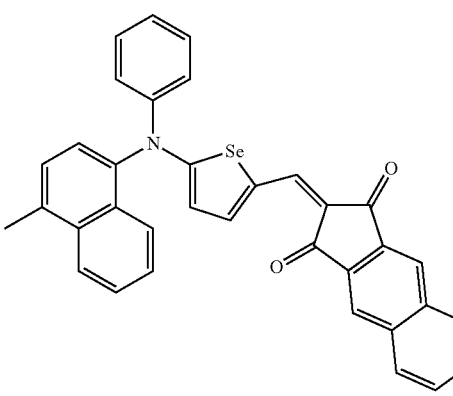
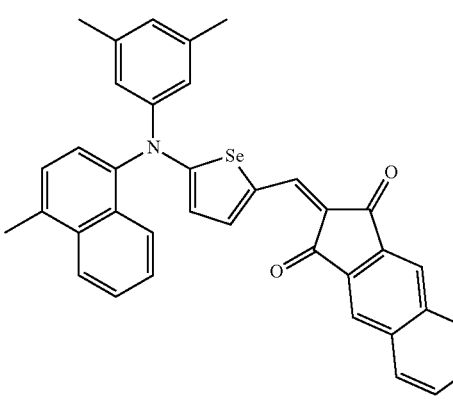
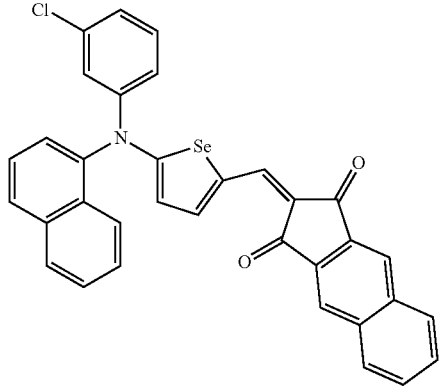

33
-continued
34
-continued
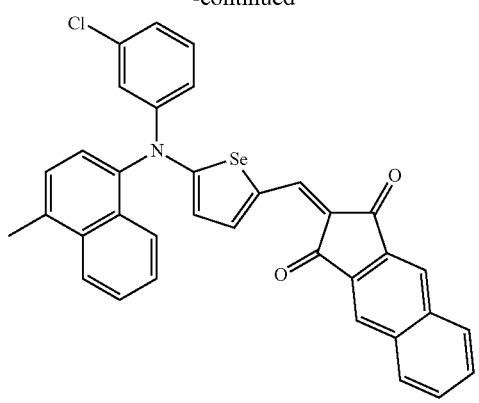
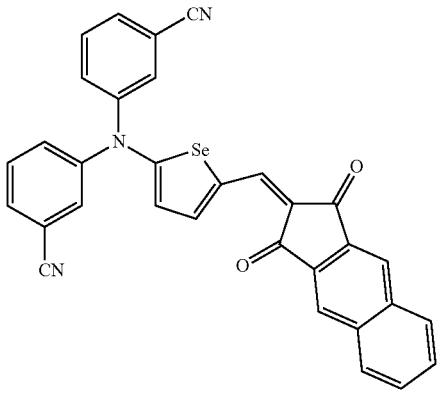

-continued
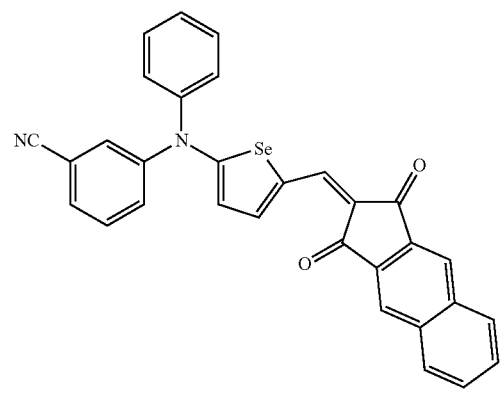
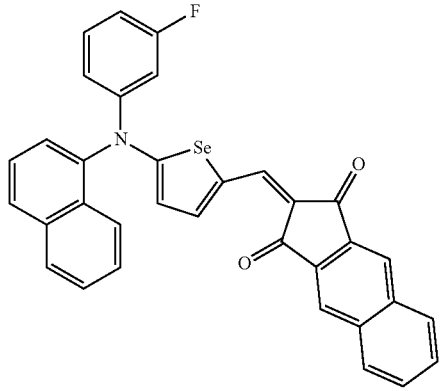
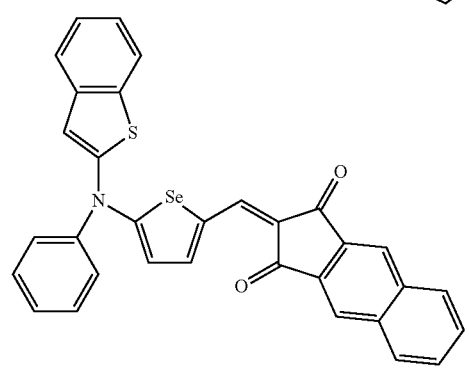
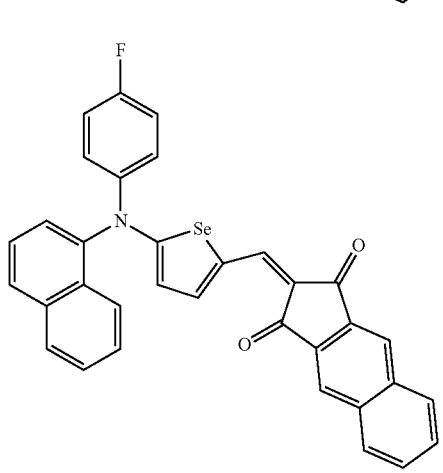
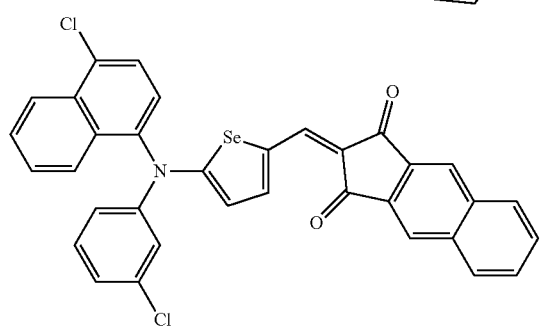
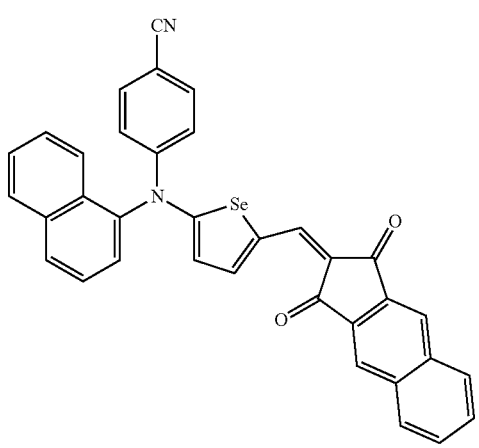
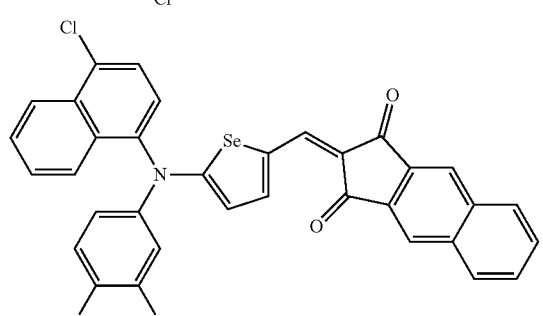
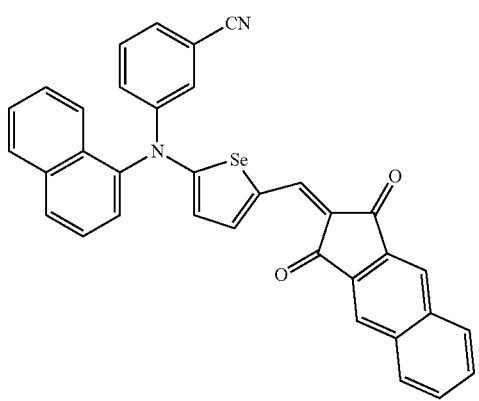
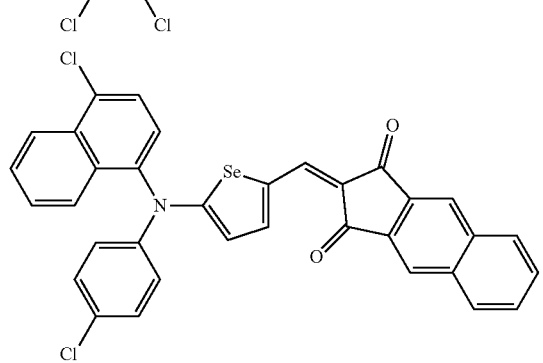

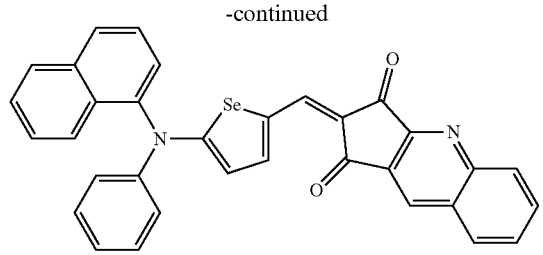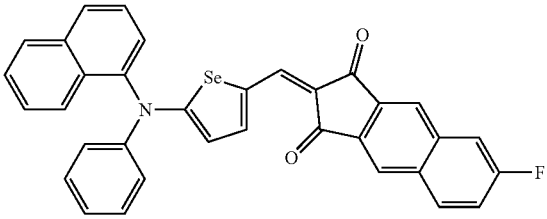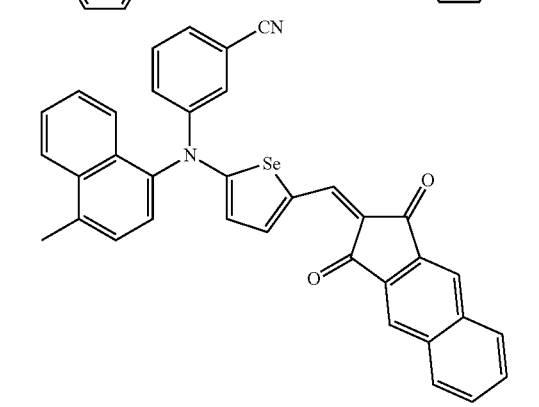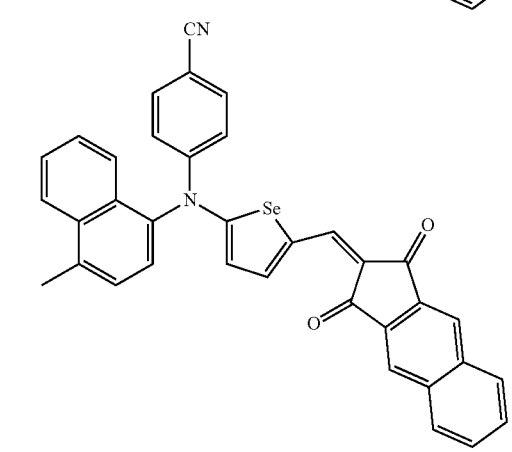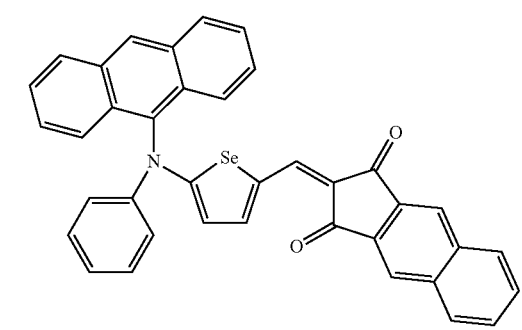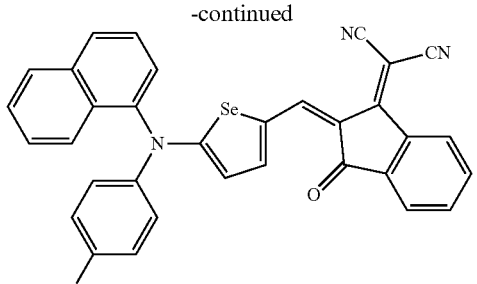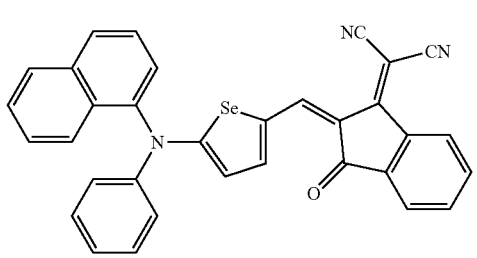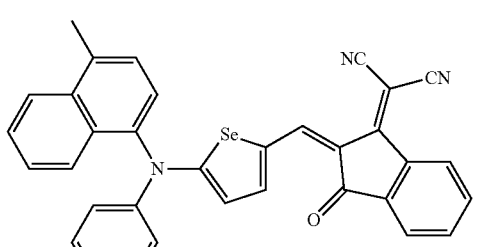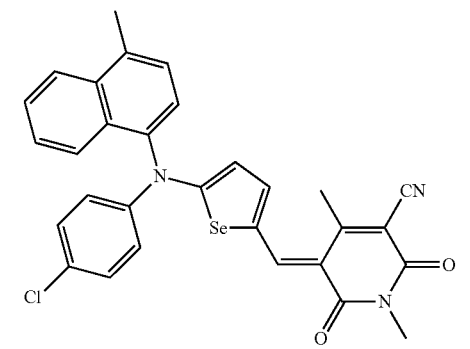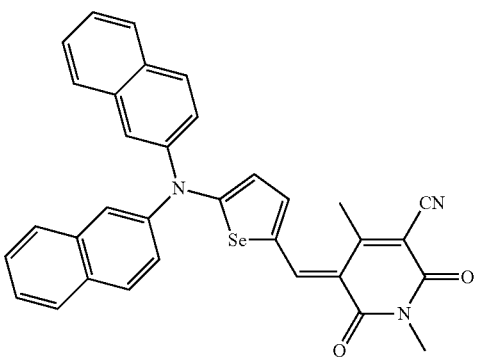

39
-continued
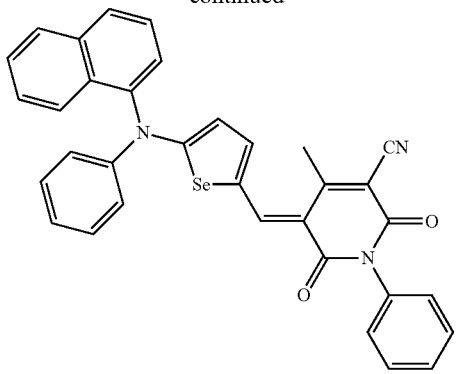
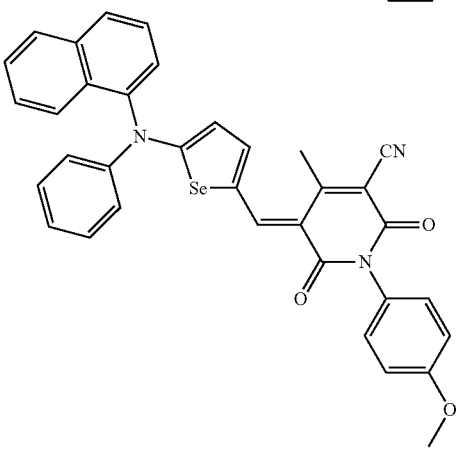
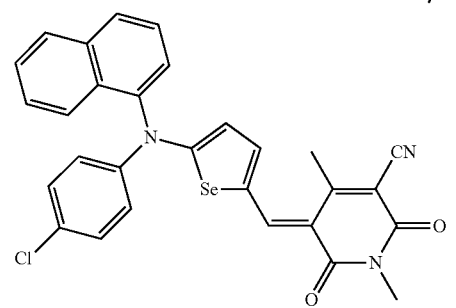
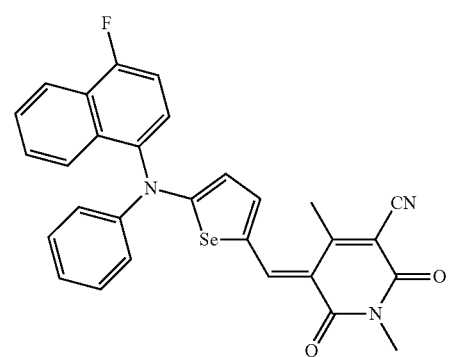
40
-continued
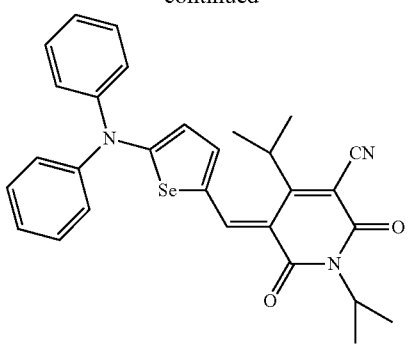
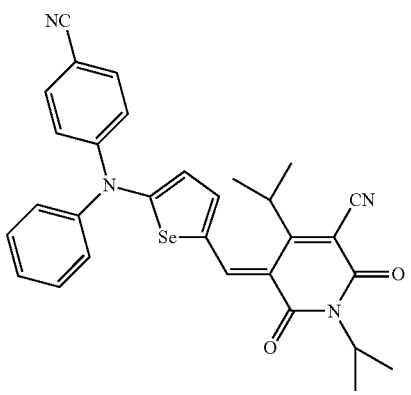
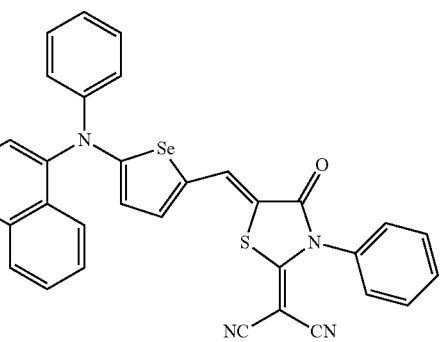
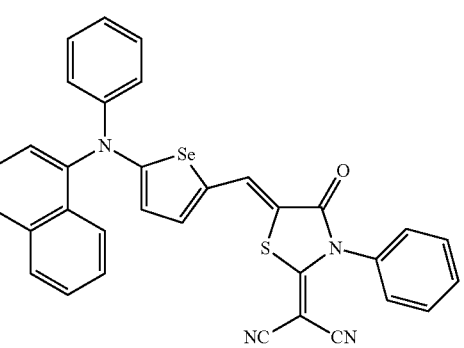

-continued

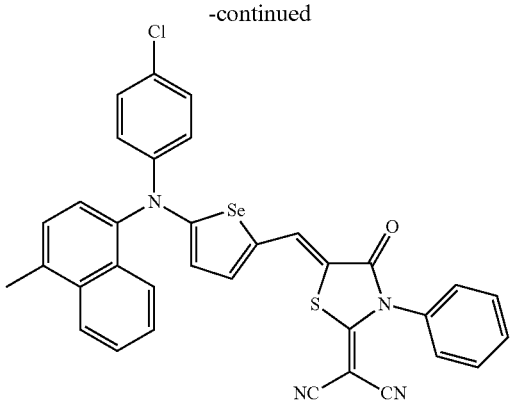

The interlayer 40 may be configured to effectively control morphology at the interface between the first electrode 10 and the photoelectronic conversion layer 30. The interlayer 40 may be configured to improve a dark current if and/or when a reverse bias is applied to the organic photoelectronic device 100.

The interlayer 40 may have a thickness of about 0.1 nm to 50 nm. If and/or when the interlayer 40 has a thickness within the range of about 0.1 nm to 50 nm, the morphology at the interface between the first electrode 10 and the photoelectronic conversion layer 30 may be further effectively controlled, and thus the dark current may be more effectively improved.

In some example embodiments, an auxiliary layer 45 is positioned between the second electrode 20 and the photoelectronic conversion layer 30, and for example may contact the photoelectronic conversion layer 30.

The auxiliary layer 45 may be configured to effectively block reverse transfer of charges from the second electrode 20 to the photoelectronic conversion layer 30, that is, a leakage of the charges when a reverse bias is applied to the organic photoelectronic device 100. For example, when the second electrode 20 is a cathode, the auxiliary layer 45 may block effectively reverse transfer of holes from the second electrode 20 to the photoelectronic conversion layer 30, that is, a leakage of the holes when the reverse bias is applied to the organic photoelectronic device 100.

The auxiliary layer 45 may be formed of a material having an energy level being capable of preventing reverse transfer of charges when a reverse bias is applied thereto and being thermally evaporated and thus having light transmittance. For example, the auxiliary layer 45 may include an inorganic material to provide a thin film having light transmittance of greater than or equal to about 70% by thermal evaporation. Within the light transmittance range, the auxiliary layer 45 may include an inorganic material to provide a thin film having light transmittance of greater than or equal to about 80%, for example, greater than or equal to about 85%.

In this way, the auxiliary layer 45 includes an inorganic material capable of being thermally-evaporated and having light transmittance and thus may prevent thermal and physical damage on the photoelectronic conversion layer 30 in a process of forming the auxiliary layer 45 and/or its subsequent process as well as effectively prevent charge leakage, and resultantly, prevent performance degradation of the organic photoelectronic device 100 due to the degradation of the photoelectronic conversion layer 30.

If the auxiliary layer 45 is formed through physical deposition including sputtering, the organic material of the photoelectronic conversion layer 30, may be damaged in the process of forming the auxiliary layer 45, deteriorating performance of the organic photoelectronic device 100. In addition, if the auxiliary layer 45 is thermally evaporated and loses light transmittance, light inflowing from the second electrode 20 may not be effectively transferred to the photoelectronic conversion layer 30, deteriorating performance of the organic photoelectronic device 100. Furthermore, if the auxiliary layer 45 is formed of an organic material rather than an inorganic material, the auxiliary layer 45 may be degraded in a subsequent process requiring a high temperature or not prevent degradation of the auxiliary layer 45 and/or photoelectronic conversion layer 30 and thus deteriorate performance of the organic photoelectronic device 100.

The auxiliary layer 45 may include an inorganic material satisfying the above characteristics, for example, at least one of a metal oxide, for example a molybdenum-containing oxide, tungsten-containing oxide, vanadium-containing oxide, rhenium-containing oxide, nickel-containing oxide, manganese-containing oxide, chromium-containing oxide, and cobalt-containing oxide. The auxiliary layer 45 may include, for example molybdenum oxide, tungsten oxide, vanadium oxide, rhenium oxide, nickel oxide, manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, potassium cobalt oxide or a combination thereof, but is not limited thereto.

The auxiliary layer 45 may further include a metal. The metal may include aluminum (Al), calcium (Ca), magnesium (Mg), lithium (Li), gold (Au), silver (Ag), copper (Cu), or a combination thereof, but is not limited thereto. The auxiliary layer 45 may include the metal oxide and the metal in various ratios, for example, in a weight ratio of about 1:9 to about 9:1, in a weight ratio of about 2:8 to about 8:2 or in a weight ratio of about 4:6 to about 6:4.

The auxiliary layer 45 may have a thickness of about 0.1 nm to about 20 nm. When the thickness is within the range, photoelectric conversion efficiency is effectively improved and leakage currents may be reduced. The auxiliary layer 45 may have, for example a thickness of about 1 nm to about 10 nm, about 1 nm to about 7 nm, or about 1 nm to about 5 nm.

The auxiliary layer 45 may be omitted as needed.

The organic photoelectronic device 100 may further include a buffer layer (not shown) between the auxiliary layer 45 and the second electrode 20. The buffer layer may include, for example, an organic material, an inorganic material, or an organic/inorganic material, and improves charge mobility.

The organic photoelectronic device 100 may further include an anti-reflection layer (not shown) on one side of the first electrode 10 or the second electrode 20.

The anti-reflection layer is positioned at a light incidence side, may decrease reflectance of incident light, and improves light absorbance. In some example embodiments, when light enters through the first electrode 10, the anti-reflection layer may be positioned under the first electrode 10, while when light enters at the second electrode 20, the anti-reflection layer may be positioned on the second electrode 20.

The anti-reflection layer may include, for example, a material having a refractive index of about 1.6 to about 2.5, for example, at least one of metal oxide, metal sulfide, and an organic material that have a refractive index within the range. The anti-reflection layer may include, for example, metal oxide including aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, a manganese-containing oxide, chromium-containing oxide, tellurium-containing oxide, or a combination thereof, metal sulfide including zinc sulfide, or an organic material including an amine derivative, but is not limited thereto.

The organic photoelectronic device may be applied to a solar cell, an image sensor, a photo-detector, a photo-sensor, and an organic light emitting diode (OLED), but is not limited thereto.

The organic photoelectronic device may be, for example, applied to an image sensor.

Hereinafter, an example of an image sensor including the organic photoelectronic device is described referring to drawings. As an example of an image sensor, an organic CMOS image sensor is described.

Figure 2:
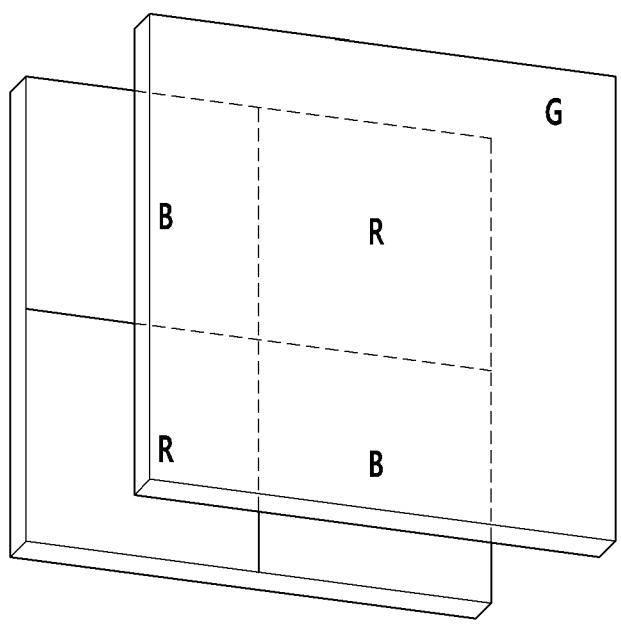
FIG. 2 is a top plan view showing an organic CMOS image sensor according to some example embodiments.
Figure 3:
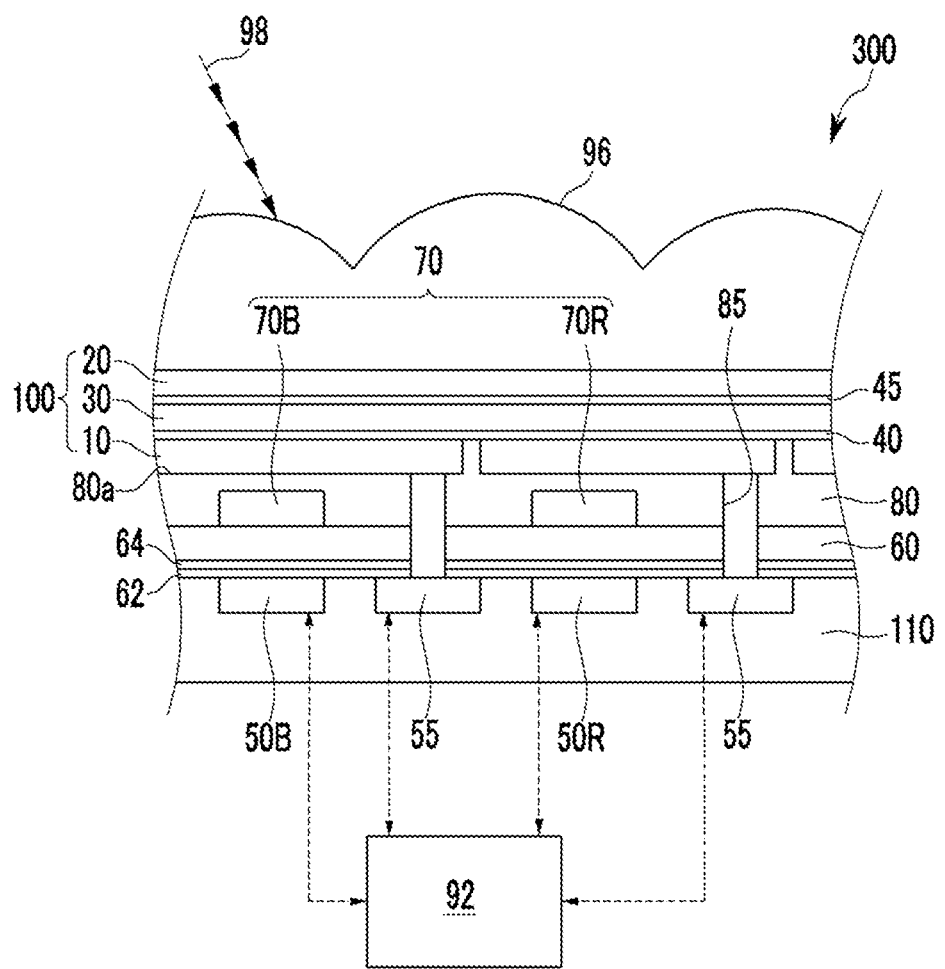
FIG. 3 is a cross-sectional view showing the organic CMOS image sensor of FIG. 2.

FIG. 2 is a schematic top plan view showing an organic CMOS image sensor according to some example embodiments, and FIG. 3 is a cross-sectional view showing the organic CMOS image sensor of FIG. 2.

Referring to FIGS. 2 and 3, an organic CMOS image sensor 300 according to some example embodiments includes a semiconductor substrate 110 integrated with photo-sensing devices 50B and 50R, a transmission transistor 92, and a charge storage 55, a lower insulation layer 60, a color filter layer 70, an upper insulation layer 80, and an organic photoelectronic device 100.

The semiconductor substrate 110 may be a silicon substrate. The semiconductor substrate 110 is integrated with the photo-sensing devices 50B and 50R, the transmission transistor 92, and the charge storage 55. One or more of the photo-sensing devices 50B and 50R may be a photodiode.

The photo-sensing devices 50B and 50R, the transmission transistor, and/or the charge storage 55 may be integrated in each pixel, and as shown in the drawing, the photo-sensing devices 50B and 50R may be included in each blue pixel and red pixel, while the charge storage 55 may be included in a green pixel.

The photo-sensing devices 50B and 50R sense light, the information sensed by the photo-sensing devices may be transferred by the transmission transistor, the charge storage 55 is electrically connected with the organic photoelectronic device 100 that will be described later, and the information of the charge storage 55 may be transferred by the transmission transistor.

A metal wire 62 and a pad 64 may be formed on the semiconductor substrate 110. In order to decrease signal delay, the metal wire 62 and pad 64 may at least partially comprise a metal having low resistivity, for example, aluminum (Al), copper (Cu), silver (Ag), and alloys thereof, but is not limited thereto. In some example embodiments, the metal wire 62 and pad 64 may be positioned under the photo-sensing devices 50B and 50R.

The lower insulation layer 60 may be formed on the metal wire 62 and the pad 64. The lower insulation layer 60 may at least partially comprise an inorganic insulating material including a silicon oxide and/or a silicon nitride, or a low dielectric constant (low K) material including SiC, SiCOH, SiCO, and SiOF. The lower insulation layer 60 may include a trench 85 exposing the charge storage 55. The trench may be filled with fillers.

The color filter layer 70 is formed on the lower insulation layer 60. The color filter layer 70 includes a first color filter and a second color filter. In the example embodiments illustrated in FIG. 3, the first color filter is a blue color filter 70B formed in the blue pixel and the second color filter is a red color filter 70R formed in the red pixel. In some example embodiments, one or more of the color filters 70 may be a green color filter.

The upper insulation layer 80 is formed on the color filter layer 70. The upper insulation layer 80 may eliminate a step caused by the color filter layer 70 and smoothen the surface 80a. The upper insulation layer 80 and lower insulation layer 60 may include a contact hole (not shown) exposing a pad, and a trench 85 exposing the charge storage 55 of a green pixel.

The organic photoelectronic device 100 is formed on the upper insulation layer 80. The organic photoelectronic device 100 includes the first electrode 10, the interlayer 40, the photoelectronic conversion layer 30, the auxiliary layer 45, and the second electrode 20 as described above. In the example embodiments illustrated in FIG. 3, the first electrode 10, the interlayer 40, the photoelectronic conversion layer 30, the auxiliary layer 45, and the second electrode 20 are sequentially stacked, but the present disclosure is not limited thereto, and the second electrode 20, the auxiliary layer 45, the photoelectronic conversion layer 30, the interlayer 40, and the first electrode 10 may be disposed in the order shown in FIG. 3.

The first electrode 10 and the second electrode 20 may be transparent electrodes, and the photoelectronic conversion layer 30, the interlayer 40, and the auxiliary layer 45 may be the same as described above with reference to FIGS. 1A-B. The photoelectronic conversion layer 30 may selectively absorb light in a green wavelength spectrum of light and replace a color filter of a green pixel.

When light enters from the second electrode 20, the light in a green wavelength spectrum of light may be mainly absorbed in the photoelectronic conversion layer 30 and photoelectronically converted, while the light in a remainder of wavelength spectra passes through the first electrode 10 and may be sensed in the photo-sensing devices 50B and 50R.

A focusing lens 96 may be further formed on the organic photoelectronic device 100. The focusing lens 96 may control a direction of incident light 98 and gather the light in one region. The focusing lens 96 may have a shape of, for example, a cylinder or a hemisphere, but is not limited thereto.

As described above, the organic photoelectronic device 100 has a stacked structure and thus may reduce the size of an image sensor and realize a down-sized image sensor.

In addition, the organic photoelectronic device 100 includes the interlayer 40 and thus may effectively control morphology at the interface of the first electrode 10 and the photoelectronic conversion layer 30 as described above as well as improve external quantum efficiency (EQE) when a reverse bias is applied thereto, and additionally includes the auxiliary layer 45 and may effectively block reverse transfer of charges from the second electrode 20 to the photoelectronic conversion layer 30 and thus improve a dark current. Accordingly, detectivity may be improved by decreasing signal noises of an image sensor including the organic photoelectronic device 100.

In addition, as described above, the auxiliary layer 45 may include an inorganic material capable of being thermally evaporated, and thus may prevent thermal degradation of the photoelectronic conversion layer 30 in a process of forming the auxiliary layer 45 and simultaneously protect the photoelectronic conversion layer 30 in a subsequent process requiring a high temperature of greater than or equal to about 150° C., for example, a process of forming a focusing lens, and resultantly prevent performance degradation of the organic photoelectronic device 100 and an image sensor including the organic photoelectronic device 100.

As described above, an organic photoelectronic device configured to selectively absorb light in a green wavelength spectrum of light is illustrated in FIGS. 2-3, but the present disclosure is not limited thereto, and may include a structure in which an organic photoelectronic device configured to selectively absorb light in a blue wavelength spectrum of light is stacked on, and a green photo-sensing device and a red photo-sensing device are integrated in, the semiconductor substrate 110, or a structure in which an organic photoelectronic device configured to selectively absorb light in a red wavelength spectrum of light is stacked on, and a green photo-sensing device and a blue photo-sensing device are integrated in, the semiconductor substrate 110.

Figure 4:
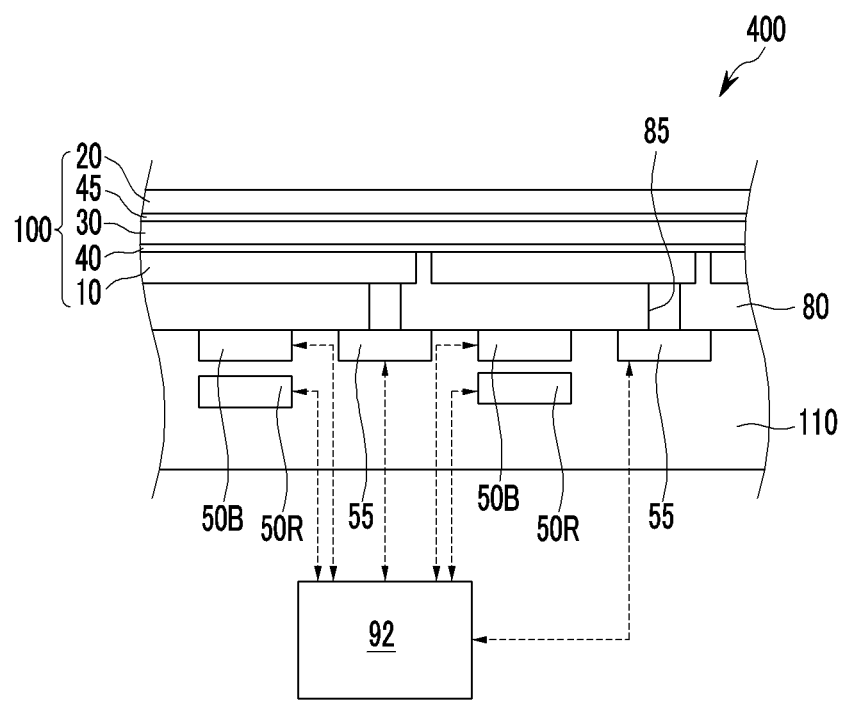
FIG. 4 is a schematic cross-sectional view showing an organic CMOS image sensor according to some example embodiments.

FIG. 4 is a schematic cross-sectional view showing an organic CMOS image sensor according to some example embodiments.

The organic CMOS image sensor 400 according to some example embodiments includes a semiconductor substrate 110 integrated with photo-sensing devices 50B and 50R, a transmission transistor 92, a charge storage 55, an upper insulation layer 80, and an organic photoelectronic device 100.

In some example embodiments, the organic CMOS image sensor 400 according to some example embodiments includes the photo-sensing devices 50B and 50R that are stacked in a vertical direction, such that the photo-sensing device 50B and 50R vertically overlap each other, and does not include a color filter layer 70. The photo-sensing devices 50B and 50R are electrically connected with the charge storage 55, and the information of the charge storage 55 may be transferred by the transmission transistor. The photo-sensing devices 50B and 50R may selectively absorb light in each wavelength spectrum of light depending on a stack depth.

A focusing lens (not shown) may be further formed on the organic photoelectronic device 100. The focusing lens may control a direction of incident light and gather the light in one region. The focusing lens may have a shape of, for example, a cylinder or a hemisphere, but is not limited thereto.

The organic photoelectronic device configured to selectively absorb light in a green wavelength spectrum of light is stacked as described above, and the red and blue photo-sensing devices are also stacked, which may reduce the size of an image sensor and realize a down-sized image sensor.

In addition, the organic photoelectronic device 100 includes the interlayer 40 and thus may effectively control morphology at the interface of the first electrode 10 and the photoelectronic conversion layer 30 as described above as well as improve external quantum efficiency (EQE) when a reverse bias is applied thereto and additionally includes the auxiliary layer 45 and may effectively block reverse transfer of charges from the second electrode 20 to the photoelectronic conversion layer 30 and thus improve a dark current. Accordingly, detectivity may be improved by decreasing signal noises of an image sensor including the organic photoelectronic device 100.

In addition, as described above, the auxiliary layer 45 is formed of an inorganic material capable of being thermally evaporated, and thus may prevent thermal degradation of the photoelectronic conversion layer 30 in a process of forming the auxiliary layer 45 and simultaneously effectively protect the photoelectronic conversion layer 30 in a subsequent process requiring a high temperature of greater than or equal to about 150° C., for example, a process of forming a focusing lens, and resultantly prevent performance degradation of the organic photoelectronic device 100 and an image sensor including the organic photoelectronic device 100.

In FIG. 4, an organic photoelectronic device configured to selectively absorb light in a green wavelength spectrum of light is illustrated, but the present disclosure is not limited thereto, and may have a structure in which an organic photoelectronic device configured to selectively absorb light in a blue wavelength spectrum of light is stacked on and a green photo-sensing device and a red photo-sensing device are integrated in a semiconductor substrate 110, or a structure in which an organic photoelectronic device configured to selectively absorb light in a red wavelength spectrum of light is stacked on and a green photo-sensing device and a blue photo-sensing device are integrated in the semiconductor substrate 110.

Figure 5:
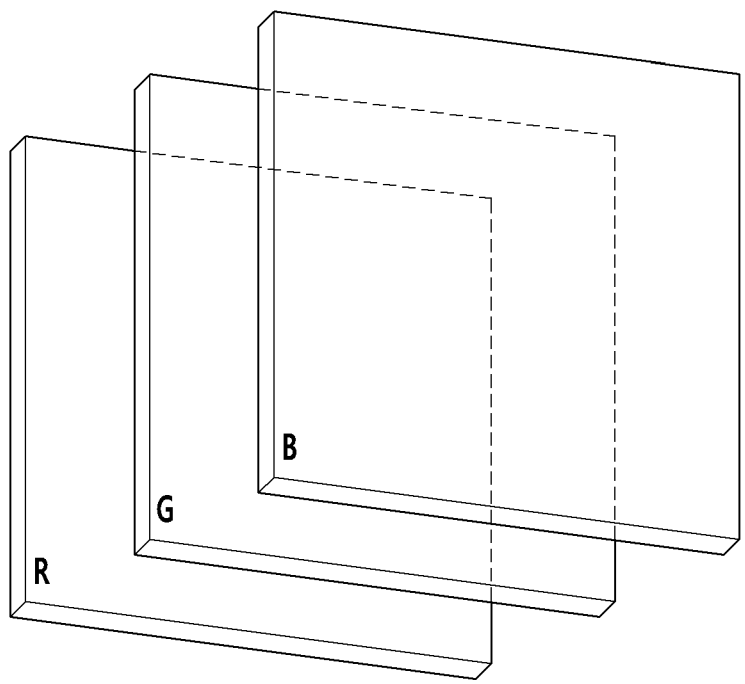
FIG. 5 is a schematic top plan view showing an organic CMOS image sensor according to some example embodiments.
Figure 6:
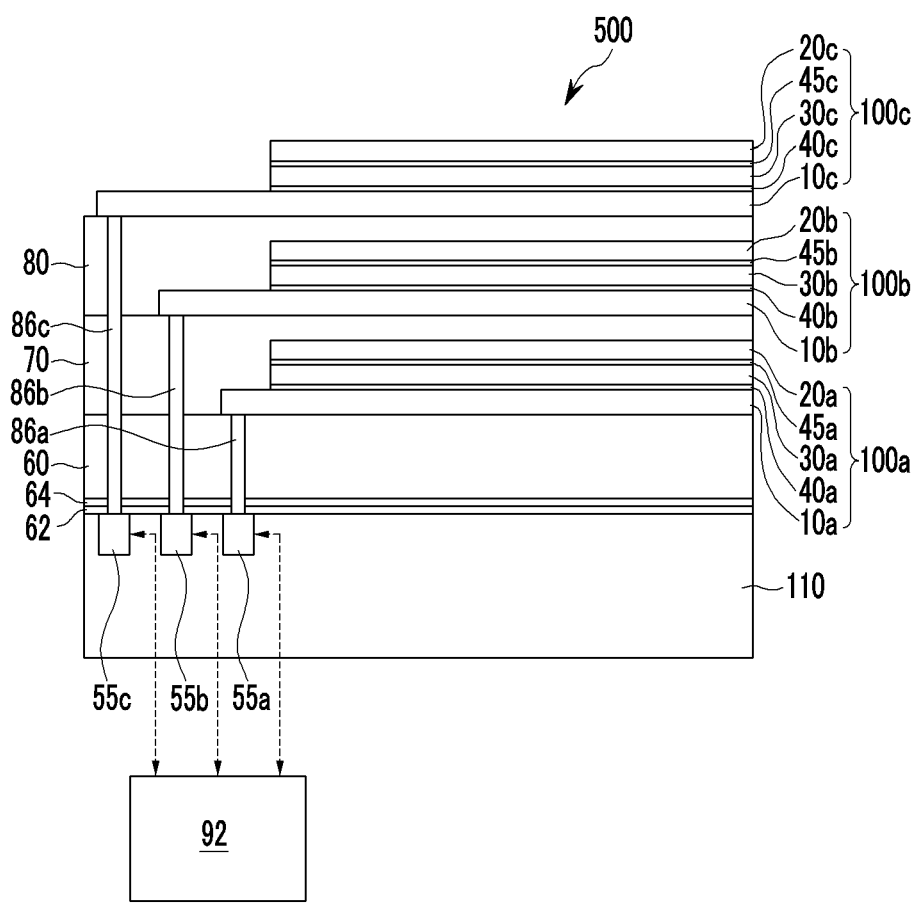
FIG. 6 is a cross-sectional view showing the organic CMOS image sensor of FIG. 5.

FIG. 5 is a schematic top plan view showing an organic CMOS image sensor according to some example embodiments, and FIG. 6 is a cross-sectional view showing the organic CMOS image sensor of FIG. 5.

The organic CMOS image sensor 500 according to some example embodiments includes a green photoelectronic device configured to selectively absorb light in a green wavelength spectrum of light, a blue photoelectronic device configured to selectively absorb light in a blue wavelength spectrum of light, and a red photoelectronic device configured to selectively absorb light in a red wavelength spectrum of light, and they are stacked.

The organic CMOS image sensor 500 according to some example embodiments includes a semiconductor substrate 110, a lower insulation layer 60, an intermediate insulation layer 70, an upper insulation layer 80, a first organic photoelectronic device 100a, a second organic photoelectronic device 100b, and a third organic photoelectronic device 100c.

The semiconductor substrate 110 may be a silicon substrate, and is integrated with the transmission transistor 92 and the charge storages 55a, 55b, and 55c.

A metal wire 62 and a pad 64 are formed on the semiconductor substrate 110, and the lower insulation layer 60 is formed on the metal wire and the pad.

The first organic photoelectronic device 100a is formed on the lower insulation layer 60.

The first organic photoelectronic device 100a includes a first electrode 10a and a second electrode 20a facing each other, a photoelectronic conversion layer 30a between the first electrode 10a and the second electrode 20a, an interlayer 40a between the first electrode 10a and the photoelectronic conversion layer 30a, and an auxiliary layer 45a between the second electrode 20a and the photoelectronic conversion layer 30a. The first electrode 10a, the second electrode 20a, the photoelectronic conversion layer 30a, the interlayer 40a, and the auxiliary layer 45a are the same as described above, and the photoelectronic conversion layer 30a selectively absorbs light in one of red, blue, and green wavelength spectra of light. For example, the first organic photoelectronic device 100a may be a red photoelectronic device.

The first electrode 10a, the interlayer 40a, the photoelectronic conversion layer 30a, the auxiliary layer 45a, and the second electrode 20a are sequentially stacked in the example embodiments illustrated in FIG. 6, but the present disclosure is not limited thereto, and the second electrode 20a, the auxiliary layer 45a, the photoelectronic conversion layer 30a, the interlayer 40a, and the first electrode 10a may be disposed in order.

The intermediate insulation layer 70 is formed on the first organic photoelectronic device 100a.

The second organic photoelectronic device 100b is formed on the intermediate insulation layer 70.

The second organic photoelectronic device 100b includes a first electrode 10b and a second electrode 20b facing each other, a photoelectronic conversion layer 30b between the first electrode 10b and the second electrode 20b, an interlayer 40b between the first electrode 10b and the photoelectronic conversion layer 30b, and an auxiliary layer 45b between the second electrode 20b and the photoelectronic conversion layer 30b. The first electrode 10b, the second electrode 20b, the photoelectronic conversion layer 30b, the interlayer 40b, and the auxiliary layer 45b are the same as described above, and the photoelectronic conversion layer 30b selectively absorbs light in one of red, blue, and green wavelength spectra of light. For example, the second organic photoelectronic device 100b may be a blue photoelectronic device.

The first electrode 10b, the interlayer 40b, the photoelectronic conversion layer 30b, the auxiliary layer 45b, and the second electrode 20b are sequentially stacked in the example embodiments illustrated in FIG. 6 but the present disclosure is not limited thereto, and the second electrode 20b, the auxiliary layer 45b, the photoelectronic conversion layer 30b, the interlayer 40b, and the first electrode 10b may be disposed in order.

An upper insulation layer 80 is formed on the second organic photoelectronic device 100b. The lower insulation layer 60, the intermediate insulation layer 70 and the upper insulation layer 80 have a plurality of through-holes 86a, 86b, 86c exposing the charge storages 55a, 55b, and 55c, respectively.

The third organic photoelectronic device 100c is formed on the upper insulation layer 80. The third organic photoelectronic device 100c includes a first electrode 10c and a second electrode 20c, a photoelectronic conversion layer 30c between the first electrode 10c and the second electrode 20c, an interlayer 40c between the first electrode 10c and the photoelectronic conversion layer 30c, and an auxiliary layer 45c between the second electrode 20c and the photoelectronic conversion layer 30c. The first electrode 10c, the second electrode 20c, the photoelectronic conversion layer 30c, the interlayer 40c, and the auxiliary layer 45a are the same as described above, and the photoelectronic conversion layer 30c selectively absorbs light in one of red, blue, and green wavelength spectra of light. For example, the third organic photoelectronic device 100c may be a green photoelectronic device.

The first electrode 10c, the interlayer 40c, the photoelectronic conversion layer 30c, the auxiliary layer 45c and the second electrode 20c are sequentially stacked in the example embodiments illustrated in FIG. 6, but the present disclosure is not limited thereto, and the second electrode 20c, the auxiliary layer 45c, the photoelectronic conversion layer 30c, the interlayer 40c, and the first electrode 10c may be disposed in order.

A focusing lens (not shown) may be further formed on the organic photoelectronic device 100c. The focusing lens may control a direction of incident light and gather the light in one region. The focusing lens may have a shape of, for example, a cylinder or a hemisphere, but is not limited thereto.

The first organic photoelectronic device 100a, the second organic photoelectronic device 100b, and the third organic photoelectronic device 100c are sequentially stacked in the example embodiments illustrated in FIG. 6, but the present disclosure is not limited thereto, and the first organic photoelectronic device 100a, the second organic photoelectronic device 100b, and the third organic photoelectronic device 100c may be stacked in various orders.

As described above, the first organic photoelectronic device 100a, the second organic photoelectronic device 100b, and the third organic photoelectronic device 100c absorbing light in different wavelength spectra of light have a stacked structure and thus may further reduce the size of an image sensor and realize a down-sized image sensor.

In addition, the organic photoelectronic device 100 includes the interlayer 40 and thus may effectively control morphology at the interface of the first electrode 10 and the photoelectronic conversion layer 30 as described above as well as improve external quantum efficiency (EQE) when a reverse bias is applied thereto and additionally includes the auxiliary layer 45 and may effectively block reverse transfer of charges from the second electrode 20 to the photoelectronic conversion layer 30 and thus improve a dark current. Accordingly, signal noise of an image sensor including the organic photoelectronic device 100 is reduced, and thus detectivity thereof may be improved.

In addition, as described above, the auxiliary layer 45 may include an inorganic material capable of being thermally evaporated and thus may prevent thermal degradation of the photoelectronic conversion layer 30 in a process of forming the auxiliary layer 45 and simultaneously effectively protect the photoelectronic conversion layer 30 in a subsequent process requiring a high temperature of greater than or equal to about 150° C., for example, a process of forming a focusing lens, and resultantly prevent performance degradation of the organic photoelectronic device 100 and an image sensor including the same.

The image sensor may be applied to, for example, various electronic devices including a mobile phone or a digital camera, but is not limited thereto.

Hereinafter, the present disclosure is illustrated in more detail with reference to some example embodiments. However, the present disclosure is not limited thereto.

Manufacture of Organic Photoelectronic Device

Example 1

A 150 nm-thick anode is formed on a glass substrate by sputtering ITO. Subsequently, a 30 nm-thick interlayer is formed by depositing a compound (HOMO: 5.46 eV, LUMO: 3.51 eV) represented by Chemical Formula A on the anode. Then, a 120 nm-thick photoelectronic conversion layer is formed by co-depositing a compound represented by Chemical Formula A and $C_{60}$ in a volume ratio of 1:1 on the interlayer. On the photoelectronic conversion layer, a 5 nm-thick auxiliary layer is formed by thermally evaporating manganese oxide ($MnO_x$, $0<x\leq2$). Subsequently, a cathode is formed by sputtering ITO on the auxiliary layer. On the cathode, an anti-reflection layer of aluminum oxide is formed, manufacturing an organic photoelectronic device.

[Chemical Formula A]

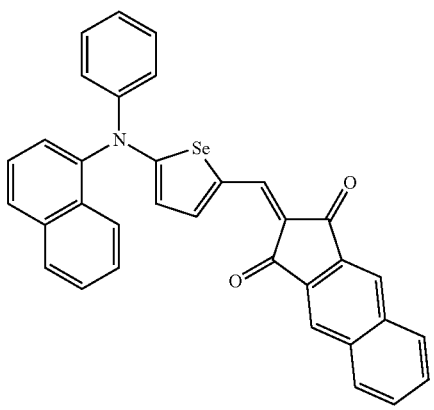

Example 2

An organic photoelectronic device is manufactured according to the same method as Example 1 except for forming the interlayer by using a compound represented by Chemical Formula B (HOMO: 5.38 eV, LUMO: 3.43 eV) instead of the compound represented by Chemical Formula A.

[Chemical Formula B]

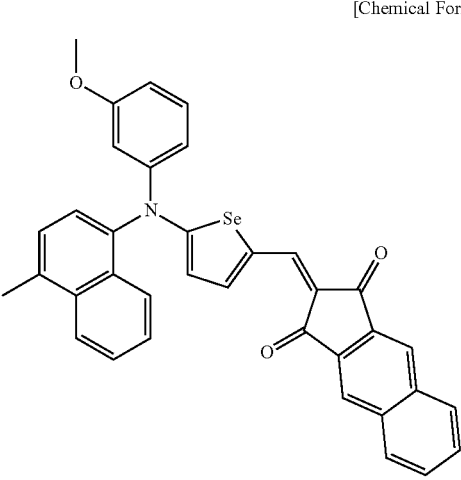

Comparative Example 1

An organic photoelectronic device is manufactured according to the same method as Example 1 except for forming the interlayer by using a compound represented by Chemical Formula C (HOMO: 5.30 eV, LUMO: 2.33 eV) instead of the compound represented by Chemical Formula A.

[Chemical Formula C]

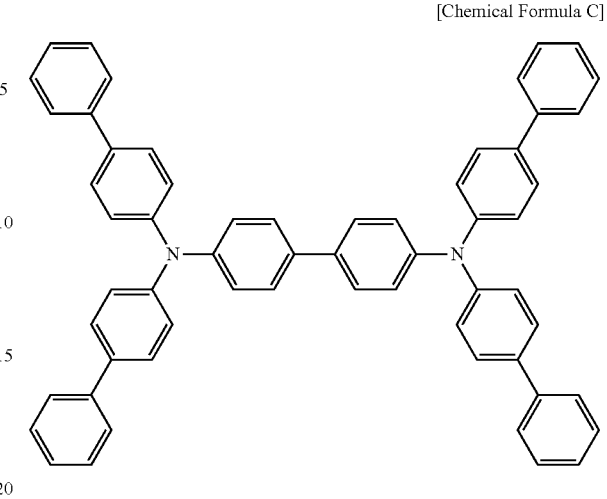

Comparative Example 2

An organic photoelectronic device is manufactured according to the same method as Example 1 except for forming a 10 nm-thick interlayer by using molybdenum oxide (MoOx, 0<x≤3) instead of the compound represented by Chemical Formula A.

Evaluation

Evaluation 1

External quantum efficiency (EQE) and a leakage current of each organic photoelectronic device according to Examples 1 and 2 and Comparative Examples 1 and 2 are evaluated.

The external quantum efficiency (EQE) is evaluated in a wavelength spectrum of light ranging from 300 nm to 800 nm ($\lambda_{max}$=560 nm) in an incident photon to current efficiency (IPCE) method. The leakage current is evaluated by dark current density and detectivity, and herein, the dark current density may be measured by a current flowing when a −3 V reverse bias is applied thereto, and the detectivity is obtained by dividing the external quantum efficiency (EQE) by the dark current.

Figure 7:
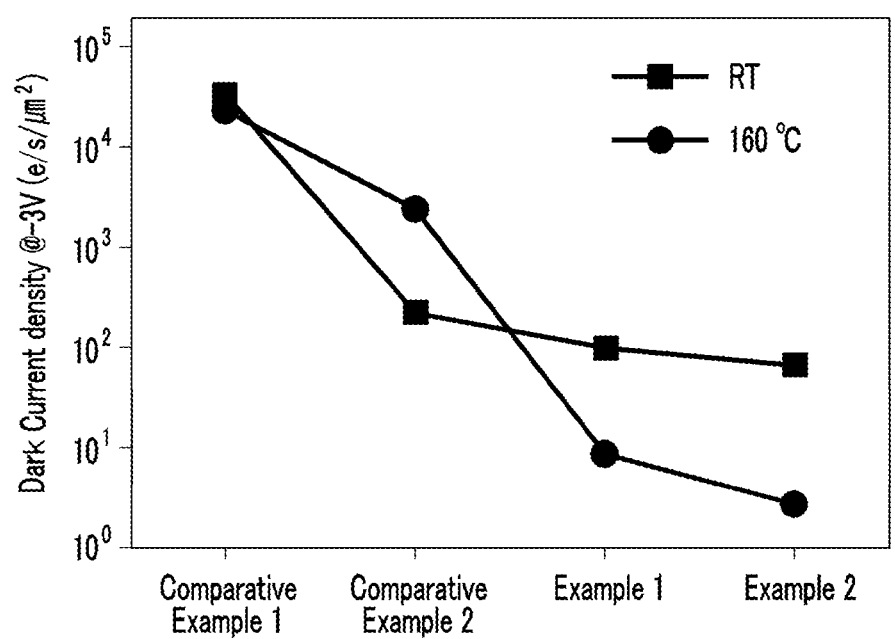
FIG. 7 is a graph showing dark current density of the organic photoelectronic devices when a reverse bias is applied thereto, according to some example embodiments.

The results are shown in FIG. 7 and Table 1.

FIG. 7 is a graph showing dark current density of organic photoelectronic devices according to Examples 1 and 2 and Comparative Examples 1 and 2 when a reverse bias is applied thereto.

TABLE 1

|  | $EQE_{560\ nm}$ (%) | Dark current density (−3 V, e/s/μm²) | Detectivity (Jones) |
| --- | --- | --- | --- |
| Example 1 | 65.4 | 100 | $9.22 \times 10^{12}$ |
| Example 2 | 62.9 | 68 | $1.11 \times 10^{13}$ |
| Comparative Example 1 | 64.9 | 32,639 | $5.07 \times 10^{11}$ |
| Comparative Example 2 | 65.4 | 230 | $6.65 \times 10^{12}$ |

Referring to Table 1, the photoelectronic devices according to Examples 1 and 2 show improved dark current density and detectivity, with an equivalent external quantum efficiency (EQE) compared with the photoelectronic devices according to Comparative Examples 1 and 2.

Evaluation 2

The organic photoelectronic devices according to Examples 1 and 2 and Comparative Examples 1 and 2 are evaluated regarding heat resistance properties.

The heat resistance properties are evaluated by measuring by heat-treating the organic photoelectronic devices according to Examples 1 and 2 and Comparative Examples 1 and 2 at 160° C. for 3 hours, and their external quantum efficiency (EQE) and leakage current changes.

The external quantum efficiency (EQE) changes are shown in Table 2, and their leakage current changes are shown in Table 3.

TABLE 2

|  | $EQE_{560\ nm}$ (%) (@ 25° C.) | $EQE_{560\ nm}$ (%) (160° C., 3 hr) |
| --- | --- | --- |
| Example 1 | 65.4 | 61.1 |
| Example 2 | 62.9 | 62.3 |
| Comparative Example 1 | 64.9 | 63.7 |
| Comparative Example 2 | 65.4 | 66.2 |

TABLE 3

|  | Dark current density (@ 25° C.) (e/s/μm$^2$) | Dark current density (160° C., 3 hr) (e/s/μm$^2$) |
| --- | --- | --- |
| Example 1 | 100 | 9 |
| Example 2 | 68 | 3 |
| Comparative Example 1 | 32,639 | 24,500 |
| Comparative Example 2 | 230 | 2,492 |

Referring to Tables 2 and 3, the organic photoelectronic devices according to Examples 1 and 2 show equivalent external quantum efficiency to that of the organic photoelectronic device according to Comparative Example 1, and a significantly lowered dark current density after a heat treatment at a high temperature.

Figure 8:
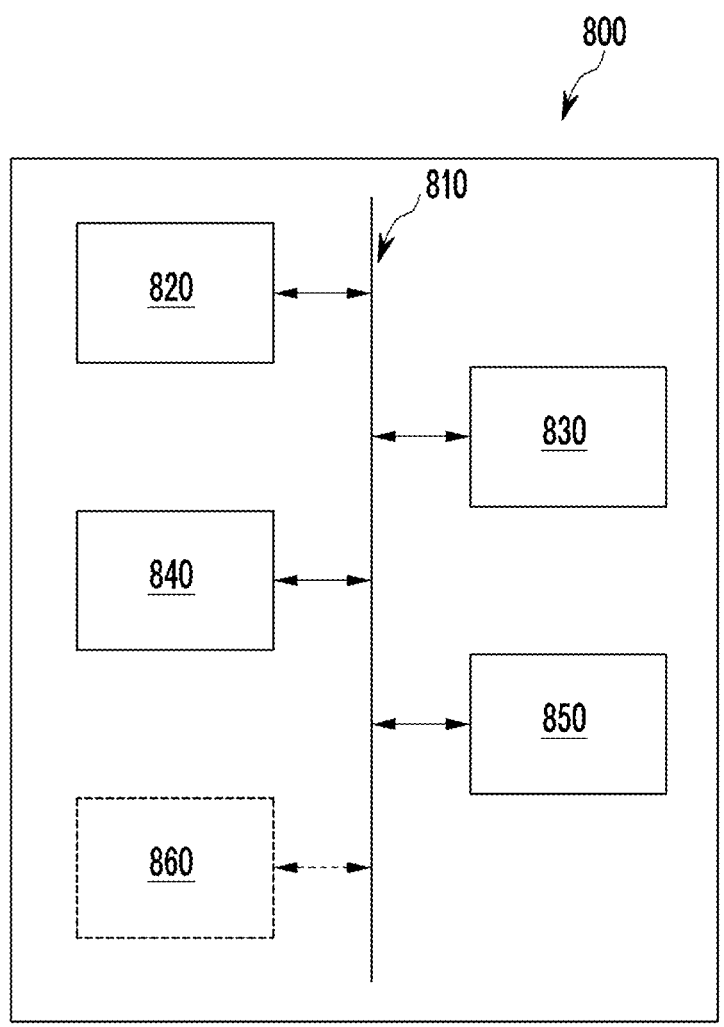
FIG. 8 is a diagram illustrating an electronic device according to some example embodiments.

FIG. 8 is a diagram illustrating an electronic device 800 according to some example embodiments.

Referring to FIG. 8, the electronic device 800 includes a memory 820, a processor 830, a device 840, and a communication interface 850. The device 840 may include any of the organic photoelectronic devices illustrated and described herein, including the example embodiments of organic photoelectronic device 100 shown in FIGS. 1A-B. The device 840 may include any of the organic CMOS image sensors illustrated and described herein, including any of the example embodiments of organic CMOS image sensor 300 shown in FIGS. 2-3, organic CMOS image sensor 400 shown in FIG. 4, and the organic CMOS image sensor 500 shown in FIGS. 5-6.

The electronic device 800 may be included in one or more various electronic devices, including, for example, a mobile phone, a digital camera, a sensor device, a biosensor device, and the like. In some example embodiments, the electronic device 800 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 820, the processor 830, the display panel 860, and the communication interface 850 may communicate with one another through a bus 810.

The communication interface 850 may communicate data from an external device using various Internet protocols. For example, the communication interface 850 may communicate sensor data generated by the device 840 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 830 may execute a program and control the electronic device 800. A program code to be executed by the processor 830 may be stored in the memory 820. An electronic system may be connected to an external device through an input/output device (not shown) and exchange data with the external device.

The memory 820 may store information output from the device 840, including information transmitted from the transistor 92. The memory 820 may be a volatile or a nonvolatile memory. The memory 820 may be a non-transitory computer readable storage medium. The memory may store computer-readable instructions that, when executed, cause the execution of one or more methods, functions, processes, etc. as described herein. In some example embodiments, the processor 830 may execute one or more of the computer-readable instructions stored at the memory 820.

In some example embodiments, the electronic device may include a display panel 860 that may output an image generated based at least in part upon information output from the device 840.

In some example embodiments, display panel 860 may be absent from the electronic device 800. In some example embodiments, the communication interface 850 may include a USB and/or HDMI interface. In some example embodiments, the communication interface 850 may include a wireless communication interface.

Figure 9:
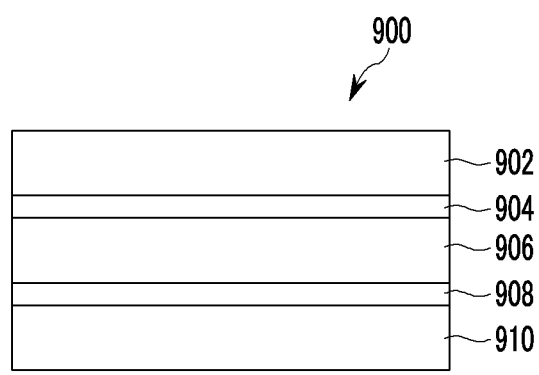
FIG. 9 is a cross-sectional view showing a solar cell according to some example embodiments.

FIG. 9 is a cross-sectional view showing a solar cell 900 according to some example embodiments. Referring to FIG. 9, a solar cell 900 includes a first electrode 902 and a second electrode 910, and a photoactive layer 906 positioned between the first electrode 902 and the second electrode 910.

A substrate (not shown) may be positioned at the first electrode 902 or the second electrode 910, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 902 and the second electrode 910 is an anode and the other is a cathode. At least one of the first electrode 902 and second electrode 910 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 902 and the second electrode 910 may be an opaque electrode, which may be made of an opaque conductor, for example, aluminum (Al), silver (Ag), gold (Au), and/or lithium (Li).

First and second auxiliary layers 904 and 908 may be positioned between the first electrode 902 and the photoactive layer 906 and between the second electrode 910 and the photoactive layer 906, respectively. The first and second auxiliary layers 904 and 908 may increase charge mobility between the first electrode 902 and the photoactive layer 906 and between the second electrode 910 and the photoactive layer 906. The first and second auxiliary layers 904 and 906 may be at least one selected from, for example, an electron injection layer (EIL), an electron transport layer, a hole injection layer (HIL), a hole transport layer, and a hole blocking layer, but are not limited thereto. One or both of the first and second auxiliary layers 904 and 908 may be omitted.

The photoactive layer 906 may have a tandem structure where at least two thereof are stacked. The solar cell 900 may be or include an organic photoelectronic device according to some example embodiments.

Figure 10:
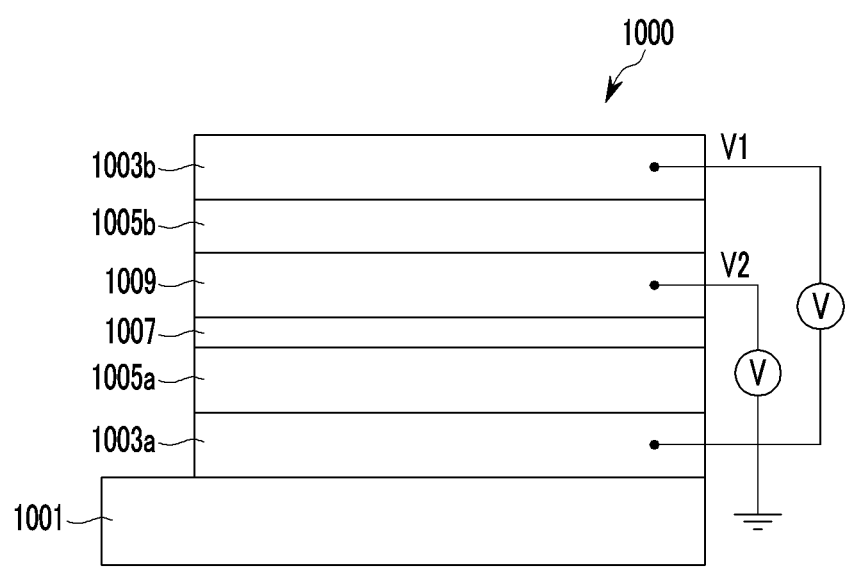
FIG. 10 is a sectional view of an organic light-emitting display apparatus according to some example embodiments.

FIG. 10 is a sectional view of an organic light-emitting display apparatus 1000 according to some example embodiments.

Referring to FIG. 10, a first electrode 1003a and a second electrode 1003b are positioned on a substrate 1001, a first emission layer 1005a is positioned on the first electrode 1003a, and a second emission layer 1005b is positioned under the second electrode 1003b.

The substrate 1001 may include a material selected from the group consisting of glass, quartz, silicon, a synthetic resin, a metal, and a combination thereof. The synthetic resin may include polyethylenenaphthalate (PEN), polyethyleneterephthalate (PET), polycarbonate, polyvinylalcohol, polyacrylate, polyimide, polynorbornene and/or polyethersulfone (PES), etc. The metal may include a stainless steel foil and/or an aluminum foil, etc.

The first electrode 1003a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1003a may have a thickness of about 10 nm to about 300 nm.

The second electrode 1003b may include a material having a work function of about 10.3 eV to about 10.7 eV or about 10.5 eV to about 10.7 eV. According to some example embodiments, the second electrode 1003b may include Ba:Al. The second electrode 1003b may have a thickness of about 100 to about 100 nm.

A middle electrode 1009 is positioned between the first emission layer 1005a and the second emission layer 1005b. The middle electrode 1009 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1007 may be positioned between the first emission layer 1005a and the middle electrode 1009, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

The organic light-emitting display apparatus 1000 may be or include an organic photoelectronic device according to some example embodiments.

Figure 11:
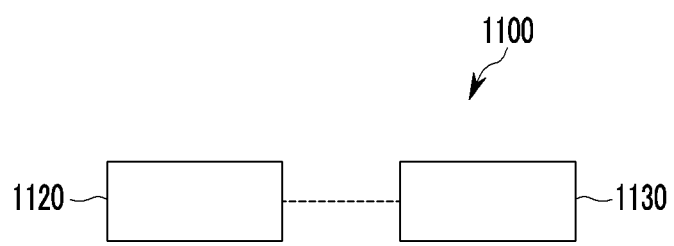
FIG. 11 is a view showing a sensor according to some example embodiments.

FIG. 11 is a view showing a sensor 1100 according to some example embodiments.

Referring to FIG. 11, a sensor 1100 (for example a gas sensor, light sensor, energy sensor, but example embodiments are not limited thereto) includes at least one electrode 1120 configured to output a signal to a processor 1130. The processor 1130 may include a microprocessor, but example embodiments are not limited thereto. The sensor 1100 may include an organic photoelectronic device according to some example embodiments. While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An organic photoelectronic device comprising:
a first electrode;
a second electrode on the first electrode;
a photoelectronic conversion layer between the first electrode and the second electrode, the photoelectronic conversion layer including a p-n junction, the p-n junction including a first material and a second material; and
an interlayer adjacent to the first electrode, the interlayer being between the first electrode and the photoelectronic conversion layer and including a third material;
wherein each of the first material and the third material are an organic material having an energy bandgap of about 1.7 eV to about 2.3 eV,
wherein,
the first material is represented by Chemical Formula 1A, and
the third material is represented by Chemical Formula 1B,

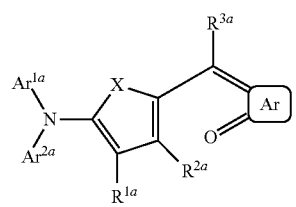

[Chemical Formula 1A]

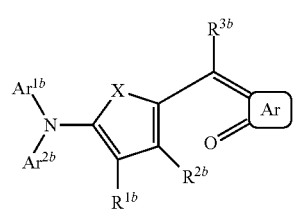

[Chemical Formula 1B]

wherein, in Chemical Formulae 1A and 1B,
X is one of Se, Te, SO, SO$_2$, and SiR$^a$R$^b$,
Ar is one of a substituted or unsubstituted 5-membered aromatic ring, a substituted or unsubstituted 6-membered aromatic ring, and a fused ring of the two or more foregoing rings,
each of Ar$^{1a}$, Ar$^{2a}$, Ar$^{1b}$, and Ar$^{2b}$ are independently one of a substituted or unsubstituted $C_6$ to $C_{30}$ aryl group, and a substituted or unsubstituted $C_3$ to $C_{30}$ heteroaryl group, and each of $R^{1a}$ to $R^{3a}$, $R^{1b}$ to $R^{3b}$, $R^a$, and $R^b$ are independently one of
hydrogen,
a substituted or unsubstituted $C_1$ to $C_{30}$ alkyl group,
a substituted or unsubstituted $C_6$ to $C_{30}$ aryl group,
a substituted or unsubstituted $C_3$ to $C_{30}$ heteroaryl group,
a substituted or unsubstituted $C_1$ to $C_6$ alkoxy group,
a halogen, and
a cyano group.

2. The organic photoelectronic device of claim 1, wherein, the first material is represented by Chemical Formula 1A-1, and
the third material is represented by Chemical Formula 1B-1,

[Chemical Formula 1A-1]

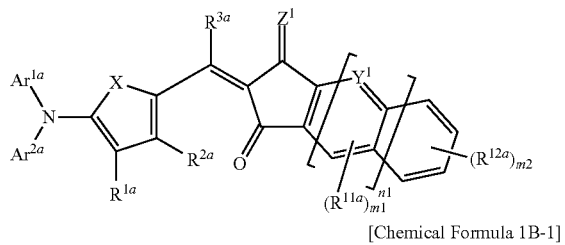

[Chemical Formula 1B-1]

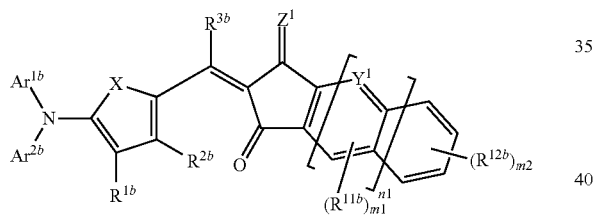

wherein, in Chemical Formulae 1A-1 and 1B-1,
X is one of Se, Te, SO, $SO_2$, and $SiR^aR^b$,
$Z^1$ is one of O and $CR^cR^d$,
$Y^1$ is one of N and $CR^e$,
each of $Ar^{1a}$, $Ar^{2a}$, $Ar^{1b}$ and $Ar^{2b}$ are independently one of
a substituted or unsubstituted $C_6$ to $C_{30}$ aryl group, and
a substituted or unsubstituted $C_3$ to $C_{30}$ heteroaryl group,
each of $R^{1a}$ to $R^{3a}$, $R^{11a}$, $R^{12a}$, $R^{1b}$ to $R^{3b}$, $R^{11b}$, $R^{12b}$, and $R^a$ to $R^e$ are independently one of
hydrogen,
a substituted or unsubstituted $C_1$ to $C_{30}$ alkyl group,
a substituted or unsubstituted $C_6$ to $C_{30}$ aryl group,
a substituted or unsubstituted $C_3$ to $C_{30}$ heteroaryl group,
a substituted or unsubstituted $C_1$ to $C_6$ alkoxy group,
a halogen, and
a cyano group,
m1 is 0 or 1,
m2 is an integer inclusively between 0 and 4, and
n1 is 0 or 1.

3. The organic photoelectronic device of claim 1, wherein, the first material is represented by Chemical Formula 1A-2, and
the third material is represented by Chemical Formula 1B-2,

[Chemical Formula 1A-2]

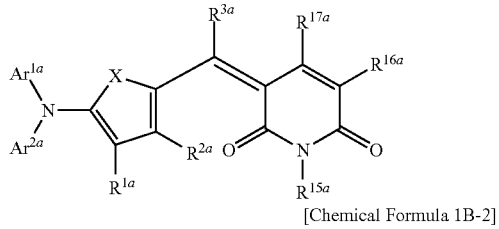

[Chemical Formula 1B-2]

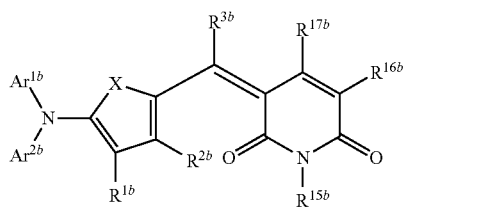

wherein, in Chemical Formulae 1A-2 and 1B-2,
X is one of Se, Te, SO, $SO_2$, and $SiR^aR^b$,
each of $Ar^{1a}$, $Ar^{2a}$ $Ar^{1b}$ and $Ar^{2b}$ are independently one of
a substituted or unsubstituted $C_6$ to $C_{30}$ aryl group, and
a substituted or unsubstituted $C_3$ to $C_{30}$ heteroaryl group, and
each of $R^{1a}$ to $R^{3a}$, $R^{15a}$ to $R^{17a}$, $R^{1b}$ to $R^{3b}$, $R^{15a}$ to $R^{17a}$, and $R^a$ and $R^b$ are independently one of
hydrogen,
a substituted or unsubstituted $C_1$ to $C_{30}$ alkyl group,
a substituted or unsubstituted $C_6$ to $C_{30}$ aryl group,
a substituted or unsubstituted $C_3$ to $C_{30}$ heteroaryl group,
a substituted or unsubstituted $C_1$ to $C_6$ alkoxy group,
a halogen, and
a cyano group.

4. The organic photoelectronic device of claim 1, wherein, the first material is represented by Chemical Formula 1A-3, and
the third material is represented by Chemical Formula 1B-3,

[Chemical Formula 1A-3]

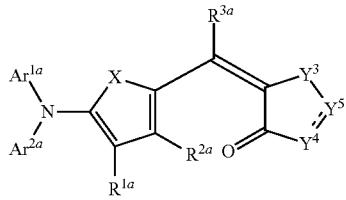

[Chemical Formula 1B-3]

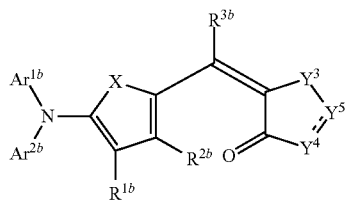

wherein, in Chemical Formulae 1A-3 and 1B-3,

X is one of Se, Te, SO, $SO_2$, and $SiR^aR^b$,
$Y^3$ is one of O, S, Se, and Te,
$Y^4$ is one of N and $NR^{18}$,
$Y^5$ is one of $CR^{19}$ and $C=CR^{20}(CN)$,
each of $Ar^{1a}$, $Ar^{2a}$ $Ar^{1b}$ and $Ar^{2b}$ are independently one of
a substituted or unsubstituted $C_6$ to $C_{30}$ aryl group, and
a substituted or unsubstituted $C_3$ to $C_{30}$ heteroaryl group, and
each of $R^{1a}$ to $R^{3a}$, $R^{1b}$ to $R^{3b}$, $R^{18}$ to $R^{20}$, $R^a$, and $R^b$ are independently one of
hydrogen,
a substituted or unsubstituted $C_1$ to $C_{30}$ alkyl group,
a substituted or unsubstituted $C_6$ to $C_{30}$ aryl group,
a substituted or unsubstituted $C_3$ to $C_{30}$ heteroaryl group,
a substituted or unsubstituted $C_1$ to $C_6$ alkoxy group,
a halogen, and
a cyano group.

5. The organic photoelectronic device of claim 1, wherein the interlayer further includes metal oxide.

6. The organic photoelectronic device of claim 5, wherein the metal oxide includes at least one of a molybdenum oxide, tungsten oxide, vanadium oxide, rhenium oxide, and nickel oxide.

7. The organic photoelectronic device of claim 1, further comprising:
an auxiliary layer between the second electrode and the photoelectronic conversion layer, wherein the auxiliary layer includes a metal oxide.

8. The organic photoelectronic device of claim 7, wherein the auxiliary layer includes at least one of a molybdenum-containing oxide, a tungsten-containing oxide, a vanadium-containing oxide, a rhenium-containing oxide, a nickel-containing oxide, a manganese-containing oxide, a chromium-containing oxide, and a cobalt-containing oxide.

9. The organic photoelectronic device of claim 8, wherein the auxiliary layer includes at least one of molybdenum oxide, tungsten oxide, vanadium oxide, rhenium oxide, nickel oxide, manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, and potassium cobalt oxide.

10. The organic photoelectronic device of claim 8, wherein the auxiliary layer further includes a metal.

11. The organic photoelectronic device of claim 10, wherein the metal includes at least one of aluminum (Al), calcium (Ca), magnesium (Mg), lithium (Li), gold (Au), silver (Ag), and copper (Cu).

12. The organic photoelectronic device of claim 1, wherein the first electrode is an anode and the second electrode is a cathode.

13. An image sensor including the organic photoelectronic device of claim 1.

14. An electronic device including the image sensor of claim 13.

15. An organic photoelectronic device, comprising:
a photoelectronic conversion layer including a p-n junction, the p-n junction including a first material and a second material; and
an interlayer on the photoelectronic conversion layer and including a third material,
wherein,
the first material is represented by Chemical Formula 1A, and
the third material is represented by Chemical Formula 1B,

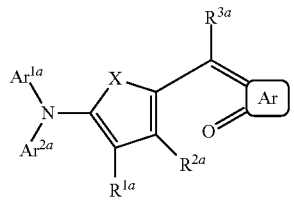

[Chemical Formula 1A]

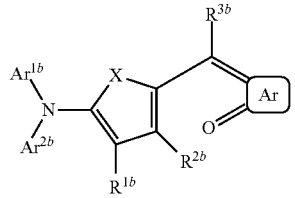

[Chemical Formula 1B]

wherein, in Chemical Formulae 1A and 1B,
X is one of Se, Te, SO, $SO_2$, and $SiR^aR^b$,
Ar is one of a substituted or unsubstituted 5-membered aromatic ring, a substituted or unsubstituted 6-membered aromatic ring, and a fused ring of the two or more foregoing rings,
each of $Ar^{1a}$, $Ar^{2a}$, $Ar^{1b}$, and $Ar^{2b}$ are independently one of
a substituted or unsubstituted $C_6$ to $C_{30}$ aryl group, and
a substituted or unsubstituted $C_3$ to $C_{30}$ heteroaryl group, and
each of $R^{1a}$ to $R^{3a}$, $R^{1b}$ to $R^{3b}$, $R^a$, and $R^b$ are independently one of
hydrogen,
a substituted or unsubstituted $C_1$ to $C_{30}$ alkyl group,
a substituted or unsubstituted $C_6$ to $C_{30}$ aryl group,
a substituted or unsubstituted $C_3$ to $C_{30}$ heteroaryl group,
a substituted or unsubstituted $C_1$ to $C_6$ alkoxy group,
a halogen, and
a cyano group.

16. An electronic device including the organic photoelectronic device of claim 15.

* * * * *